(12) United States Patent
Hidaka

(10) Patent No.: US 6,172,918 B1
(45) Date of Patent: *Jan. 9, 2001

(54) SEMICONDUCTOR MEMORY DEVICE ALLOWING HIGH-SPEED OPERATION OF INTERNAL DATA BUSES

(75) Inventor: Hideto Hidaka, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/327,155

(22) Filed: Jun. 3, 1999

(30) Foreign Application Priority Data

Dec. 8, 1998 (JP) .................................. 10-348676

(51) Int. Cl.[7] ..................................... G11C 7/12
(52) U.S. Cl. .............................. 365/189.11; 365/230.03; 365/202; 365/190; 365/189.05
(58) Field of Search .................. 365/189.11, 230.03, 365/202, 190, 189.05

(56) References Cited

U.S. PATENT DOCUMENTS

| | | | |
|---|---|---|---|
| 5,309,393 | * 5/1994 | Sakata et al. | 365/189.01 |
| 5,621,740 | * 4/1997 | Kamada | 714/727 |
| 5,657,286 | 8/1997 | Arimoto | 365/205 |
| 5,675,542 | * 10/1997 | Ford | 365/189.11 |
| 6,003,148 | 12/1999 | Yamauchi, et al. | 714/711 |

FOREIGN PATENT DOCUMENTS 5-54634 * 3/1993 (JP) .............................. G11C/11/401

OTHER PUBLICATIONS

"Ultra LSI Memory", by K. Ito, Advanced Electronics Series, Nov. 1994, pp. 167–175 and pp. 181–183.*

"A Flexible Redundancy Technique for High–Density DRAM's", by Horiguchi et al., IEEE Journal of Solid–State Circuits, vol. 26, No. 1, Jan. 1991, pp. 12–17.*

* cited by examiner

Primary Examiner—Andrew Q. Tran
(74) Attorney, Agent, or Firm—McDermott, Will & Emery

(57) ABSTRACT

A current mirror-type load circuit is provided for a global data line pair. A read gate amplifier used as a block select gate for each of the local data line pairs. A read gate amplifier includes a MOS transistor having its gate connected to a corresponding local data line. A data write driver writes the logic-inverted data of the write data upon equalization after the data write operation. A high-speed access becomes possible by reducing the time required for reading of data and by reducing the write recovery time.

27 Claims, 17 Drawing Sheets

F I G. 1
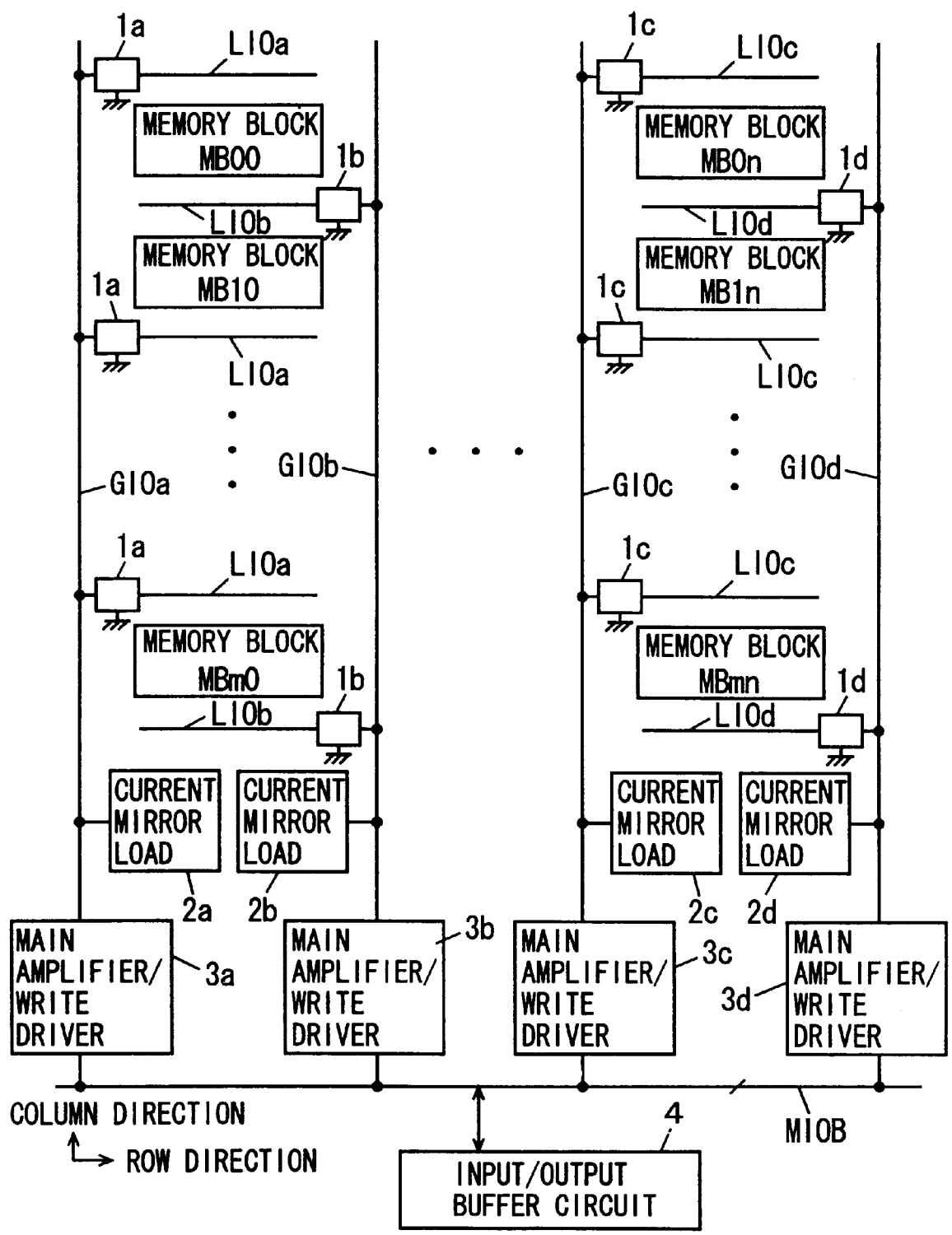

F I G. 2 4  PRIOR ART

SEMICONDUCTOR MEMORY DEVICE ALLOWING HIGH-SPEED OPERATION OF INTERNAL DATA BUSES

BACKGROUND OF THE INVENTION

1. Field of the Invention

The present invention relates to a semiconductor memory device, and particularly to an arrangement for reducing an access time. More specifically, the present invention relates to an arrangement for driving an internal data line pair at a high speed.

2. Description of the Background Art

In a semiconductor memory device, an increase in storage capacity leads to an increase in the number of memory cells. Accordingly, bit lines and internal data lines become longer. As the bit lines and the internal data lines for transmitting data get longer, associated parasitic capacitance increases. In order to reduce such parasitic capacitance to transfer data at a high speed, a hierarchical I/O line arrangement is utilized in which signal lines for transmitting data are divided.

FIG. 23 is a schematic representation of an arrangement of an array portion of a conventional semiconductor memory device. In FIG. 23, a memory array MA is divided into a plurality of memory blocks MB00-MBmn. Memory blocks MBi0–MBin (i=0–m) arranged in alignment in a row-direction form a row block and share a word line. Memory blocks MB0j–MBmj (j=0–n) arranged in alignment in a column-direction share a column select line extending from a column decoder. Each of memory blocks MB00–MBmn has memory cells arranged in a matrix of rows and columns.

For each of memory blocks MB00–MBmn, a local data line pair LIO is disposed. In one example, in a column block including memory blocks MB00–MBm0, local data line pairs LIOa and LIOb are arranged on either side in the column-direction of a memory block MBiO. The local data line pair disposed between adjacent memory blocks MBiO and MB (i+1)0 in the column-direction is shared by these adjacent memory blocks.

In the column block including memory blocks MB0n–MBmn, local data line pairs LIOc and LIOd are disposed corresponding to each memory block. Similarly in this column block, local data line pairs LIOc and LIOd are shared by adjacent memory blocks in the column-direction.

A global data line pair GIO extending in the column-direction is provided in common to the memory blocks in a column block. Global data line pair GIO is coupled through a block select gate BSG to a local data line pair contained in a corresponding column block. In FIG. 23, local data line pair LIOa is coupled to a global data line pair GIOa via a block select gate BSGa, and local data line pair LIOb is coupled to a global data line pair GIOb via a block select gate BSGb. In addition, local data line pair LIOc is coupled to a global data line pair GIOc via a block select gate BSGc, and local data line pair LIOd is coupled to a global data line pair GIOd via a block select gate BSGd. These block select gates BSGa–BSGd are rendered conductive according to a row block select signal. Thus, in one column block, one memory block is selected, and the corresponding local data line pair is coupled to the corresponding global data line pair GIO through a block select gate.

Global data line pairs GIOa-GIOd are coupled in common to a write/read circuit WRC. Write/read circuit WRC includes a write driver for transmitting write data and a main amplifier for amplifying memory cell data. Write/read circuit WRC is coupled via a main data line pair MIO to an input/output buffer circuit, not shown. In the write/read circuit WRC, a write circuit or a read circuit corresponding to a selected column block is activated according to a column block select signal.

FIG. 24 is a diagram representing the arrangement of a portion related to a memory block in a memory array shown in FIG. 23. In a memory block MB, memory cells MC are disposed in a matrix of rows and columns. For each column of memory cells, a bit line pair BLP is disposed, and for each row of memory cells, a word line WL is disposed. The word line WL is provided in common to the memory blocks included in a row block. FIG. 24 shows representatively a word line WL, a bit line pair BLP, and a memory cell MC disposed corresponding to an intersection of bit line pair BLP and word line WL. Bit line pair BLP includes bit lines BL and ZBL for transmitting complementary data signals. Memory cell MC is disposed corresponding to an intersection of bit line BL or ZBL and word line WL. In FIG. 24, memory cell MC is disposed at an intersecting portion of bit line BL and word line WL.

Bit line pair BLP is coupled to a sense amplifier SA via a bit line isolating gate BIG. Sense amplifier SA is shared by memory block MB and another memory block not shown. Bit line isolating gate BIG is made to conduct in response to a bit line isolating instruction signal φBLI. When the other memory block sharing the same sense amplifier SA is selected, bit line isolating instruction signal φBLI attains a low or logic "L" level, causing memory block MB to be isolated from sense amplifier SA.

Sense amplifier SA is coupled to a local data line pair LIO through a column select gate CSG rendered conductive in response to a column select signal Y on a column select line CSL. Local data line pair LIO includes local data lines LI/O and ZLI/O provided corresponding to bit lines BL and ZBL, for transmitting complementary data signals.

Local data line pair LIO is connected to global data line pair GIO via a block select gate BSG rendered conductive in response to a row block select signal φRB. Global data line pair GIO also includes complementary data lines GI/O and ZGI/O and is coupled to a main amplifier MAP.

Each of bit line isolating gate BIG, column select gate CSG, and block select gate BSG is formed by a transfer gate consisting of an MOS transistor. Now, the operation will be briefly described.

First of all, when word line WL is selected according to an address signal, the voltage of word line WL is raised and the information stored in memory cell MC is transmitted to bit line BL. Bit line isolating instruction signal φBLI is at a high or logic "H" level, and bit lines BL and ZBL are coupled to sense amplifier SA. A paired memory block, not shown, is isolated from sense amplifier SA. When data is read from memory cell MC, sense amplifier SA, in turn, is activated and differentially amplifies the voltages of bit lines BL and ZBL. Since the data from the memory cell is not read out on bit line ZBL, the voltage on bit line BL is amplified, with the voltage on bit line ZBL used as the reference voltage. After differentially amplifying the voltage of bit lines BL and ZBL, sense amplifier SA holds the amplified voltages.

Thereafter, the column select operation begins. Column select signal Y transmitted from the column decoder (not shown) on column select line CSL attains the logic "H" level of the selected state, and column select gate CSG is made to conduct, thus allowing the data held by sense amplifier SA to be transmitted on local data line pair LIO. Block select gate BSG is rendered conductive according to row block select signal ORB while the word line is selected, and connects local data line pair LIO to global data line pair GIO. Therefore, when column select gate CSG is made to conduct and data is transmitted on local data line pair LIO, the data on local data line pair LIO is transmitted to global data line pair GIO via block select gate BSG. The data on global data line pair GIO is amplified by main amplifier MAP and is transmitted to an output buffer circuit, not shown.

Local data line pair LIO is provided only for memory block MB. The number of column select gates CSG connected to local data line pair LIO is relatively small so that the parasitic capacitance of local data line pair LIO is also relatively small. Moreover, global data line pair GIO is provided in common to the memory blocks in the column block and only block select gates BSG are connected to global data line pair GIO so that the parasitic capacitance of global data line pair GIO is also relatively small. Thus, since the parasitic capacitance of local data line pair LIO and global data line pair GIO is relatively small, data may be transmitted to main amplifier MAP by driving local data line pair LIO and global data line pair GIO by sense amplifier SA. Main amplifier MAP drives main data line pair MIO shown in FIG. 23. Parasitic capacitance of main data line pair MIO is a line capacitances which is relatively small. Further, main amplifier MAP is provide only for global data line pair, and main amplifier MAP can be made relatively large in size so that it can transmit data to the output buffer circuit at a high speed. Thus, even when the storage capacity is larger, data can be read out at a high speed.

Even with the hierarchical I/O arrangement consisting of local data lines and global data lines shown in FIGS. 23 and 24, however, when the storage capacity increases, the length of global data line pair GIO increases accordingly, leading to non-negligible line capacitance. As a result, signal propagation delay occurs, and the high-speed access becomes difficult. In particular, when data is read, column select signal Y is transmitted along the column-direction, and the data from a selected memory block is transmitted, via global data line pair GIO, in the opposite direction along the column-direction. Thus, as storage capacity increases and the size or geometric feature in the column-direction becomes larger, the time from the column selection operation to the amplification of data by main amplifier MAP gets this disadvantageously long. For instance, in the arrangement shown in FIG. 23, if memory block MB00 is selected, since the column decoder is normally disposed near write/read circuit WRC, column select signal Y is transmitted in a direction from memory block MBm0 to memory block MB00, for the column select operation. Thereafter, data from the selected column is read out, and the read data is transmitted via global data line pairs GIOa and GIOb, in the direction opposite to the direction in which the column select signal is propagated. Since access time is determined by the worst case, the time required to read out the data from the memory block farthest away from the column decoder determines the access time. Therefore, if the signal propagation delay of the global data line becomes long, a high-speed data read operation becomes impossible.

Moreover, an increase in the number of memory blocks included in a column block leads to an increase in the number of block select gates BSG, which results in increased parasitic capacitance of the global data line pair and in increased line capacitance, causing the signal propagation delay. Furthermore, parasitic capacitance of local data line pair LIO caused by a column select gate connecting thereto becomes non-negligible for a high-speed read operation.

One arrangement intended for a data read operation at the highest possible speed to solve the above problems is described in Japanese Patent Laying-Open No. 5-54634.

FIG. 25 is a diagram representing another arrangement of the conventional hierarchical I/O line pair arrangement described in the abovementioned prior art document. FIG. 25 shows the arrangement of a portion related to one bit line pair BLP. Bit line pair BLP is provided with an equalizing circuit EQ for equalizing the potential of bit line pair BLP to an intermediate potential during a standby cycle, a sense amplifier SA for differentially amplifying the voltages of bit line pair BLP, a write select gate WSG rendered conductive according to column select signal Y for connecting bit line pair BLP and write data transmission line pair WI in a data write operation, and a read select gate RSG for transmitting the voltages on bit line pair BLP to local data line pair LIO according to column select signal Y in a data read operation. In the arrangement shown in FIG. 25, write data and read data are transmitted through separate signal line pairs.

Write select gate WSG includes n-channel MOS transistors T5 and T6 rendered conductive in response to the activation of write operation activating signal WE in a data write operation, and n-channel MOS transistors T7 and T8 rendered conductive upon the activation of column select signal Y for connecting bit line pair BLP with write data line pair WI via transfer gates T5 and T6.

Read select gate RSG includes n-channel MOS transistors T1 and T2 for receiving at their gates the voltages on bit lines BL and ZBL of bit line pair BLP and n-channel MOS transistors T3 and T4 rendered conductive in response to the activation of column select signal Y for connecting MOS transistors T1 and T2 to local data line pair LIO. The sources of MOS transistors T1 and T2 are connected to a ground node.

Additionally, a load circuit LOAD and a block select gate BSG are connected to local data line pair LIO. Load circuit LOAD includes p-channel MOS transistors T9 and T10 forming a current mirror circuit for supplying current to local data line pair LIO and a p-channel MOS transistor T11 rendered conductive when block select signal φBR is deactivated for equalizing the voltages of respective data lines of local data line pair LIO.

Block select gate BSG includes transfer gates T12 and T13 formed by n-channel MOS transistors receiving at their gates the voltages on the data lines of local data line pair LIO, and n-channel MOS transistors T14 and T15 for connecting transfer gates T12 and T13 to global data line pair GIO according to block select signal φBR. MOS transistors T12 and T13 each has one conduction node connected to a ground node. Global data line pair GIO is coupled to main amplifier MAP.

In the arrangement shown in FIG. 25, write operation activating signal WE is activated in a data write operation, and MOS transistors T5 and T6 in write select gate WSG are rendered conductive. When column select signal Y is activated or in a logic "H" level, MOS transistors T7 and T8 of write select gate WSG are made conductive and write data line pair WI is connected to bit line pair BLP. Data transmitted to write data line pair WI is transmitted to bit line pair BLP, and the data is written into a selected memory cell connected to bit line pair BLP.

On the other hand, in a data read operation, write operation activating signal WE is in the deactivated state or at a logic "L" level and write select gate WSG maintains its non-conductive state. Block select signal φBR for the selected memory block attains a logic "H" level, and MOS transistor T11 in load circuit LOAD becomes non-conductive. Voltage equalization of local data line pair LIO is stopped and MOS transistors T9 and T10 operate as a current supply circuit. When the memory cell data is read out and the voltage difference is developed on bit line pair BLP, column select signal Y is driven to a logic "H" level or the selected state. In read select gate RSG, MOS transistors T3 and T4 are rendered conductive, and MOS transistors T1 and T2 are connected to local data line pair LIO. The gates of these MOS transistors T1 and T2 are connected to bit lines BL and ZBL, respectively. Thus, depending on the voltage difference between the bit lines BL and ZBL, the conductances of MOS transistors T1 and T2 differ and the magnitudes of discharge currents from the data lines of local data line pair differ, causing the voltage difference on local data line pair LIO. The voltage difference of local data line pair LIO is transmitted to the gates of MOS transistors T12 and T13 included in block select gate BSG. MOS transistor T14 and T15 are made conductive by state of block select signal φBR in the selected state. Therefore, data lines of global data line pair GIO are driven by MOS transistors T12 and T13, creating between the data lines of global data line pair GIO the voltage difference sensed and amplified by main amplifier MAP.

In read select gate RSG in the arrangement shown in FIG. 25, the gates of MOS transistors T1 and T2 receive the voltages of bit lines BL and ZBL. Thus, column select signal Y can be driven to the selected state before the activation of sense amplifier SA so that data can be read out at a fast timing. In addition, since current amplification is performed on global data lines and local data lines, data can be read at a higher speed than in the case of voltage amplification.

As shown in FIG. 25, in the case of the arrangement in which the voltage difference of the bit line pair is converted into a current difference before it is read out, there is a need to provide a read gate RSG for each bit line pair and a current mirror-type load circuit for each local data line pair LIO. As a result, the area occupied by the column select portion, and thus the chip area, becomes larger when compared with the typical arrangement of the column select gate formed by a pair of switching transistors. In addition, there is a need to provide a current mirror-type load circuit and a block select gate for each local data line pair, which results in an increased area occupied by the circuitry provided in the connecting portions between the local data line pairs and global data line pairs.

FIG. 26 is a diagram representing the arrangement of a load circuit LIO shown in FIG. 24. In FIG. 26, load circuit LD includes an equalizing transistor T22 rendered conductive during the activation (logic "L" level) of an equalizing instruction signal φEQZ for equalizing the voltages of data lines GI/O and ZGI/O of global data line pair GIO, and p-channel MOS transistors T20 and T21 rendered conductive during the deactivation of a write driver activating signal φWDE for pulling up global data lines GI/O and ZGI/O to the power-supply voltage Vcc level. Global data line pair GIO is provided with a write buffer driver WBD activated in response to the activation of write driver activating signal φWDE for generating write data from the data on main data line pair MIO and transmitting the write data to global data line pair GIO, and a main amplifier MAP activated in response to a main amplifier activating signal φMPE for amplifying the data on global data line pair GIO.

A plurality of block select gates BSG are connected to global data line pair GIO. The operation of load circuit LD will be described briefly with reference to the signal waveform diagram shown in FIG. 27.

An equalizing instruction signal φZEQ stays at a logic "H" level for a prescribed period according to an address transition detecting signal. When equalizing instruction signal φZEQ attains the logic "H" level, the data from the selected memory cell is read out on global data line pair GIO according to a column select signal. In a data read operation, MOS transistors T20 and T21 in load circuit LD are in the conductive state. Thus, the voltage levels of global data line pair GIOs change to those determined by the ratio of the resistances of MOS transistors of the sense amplifier to the on resistances of MOS transistors T20 and T21 of load circuit LD, and small amplitude voltage signals are transmitted. When the voltage difference on global data line pair GIO becomes sufficiently large, main amplifier activating signal φMPE is activated, causing main amplifier MAP to amplify the signals on global data line pair GIO and transmits the amplified signal on main data line pair MIO.

After a prescribed period of main amplifier activating signal φMPE being in the activated state or at a logic "H" level, when the reading of the data on global data line pair is completed, main amplifier activating signal φMPE becomes deactivated or attains a logic "L" level, and main amplifier MAP is deactivated. Then, equalizing instruction signal φZEQ is activated or attains a logic "L" level, thereby making equalizing transistor T22 conductive, which starts the equalization of the voltages of global data line pair GIO. In a data read operation, the voltage amplitude of global data line pair GIO is small, so that global data line pair GIO is precharged to the power-supply voltage Vcc level in a relatively short time.

Similarly, in a data write operation, equalizing instruction signal ZEQ is driven to the deactivated state or the logic "H" level according to the transition of address. In accordance with the column select operation, global data line pair GIO is connected to the selected column, and the voltage level of global data line pair GIO change depending on the latch data of the sense amplifier. Thereafter, write driver activating signal φWDE is set to a logic "H" level for a prescribed period, causing write buffer driver WBD to operate to generate internal write data according to the data signals provided through main data line pair MIO. During the operation of write buffer driver WBD, MOS transistors T20 and T21 in load circuit LD are in the non-conductive state. Therefore, global data line pair GIO is driven to the power-supply voltage Vcc level and the ground voltage level according to the internal write data. The voltages Vcc and GND on global data line pair GIO are transmitted on the selected column for writing of the data.

When the write operation is completed, write driver activating signal WDE is deactivated or attains a logic "L" level, and thereafter, equalizing instruction signal φZEQ at the logic "H" level is activated and attains the logic "L" level. When write driver activating signal φWDE attains a logic "L" level, MOS transistors T20 and T21 in load circuit LD are made conductive to effect the pull up of the data line at the ground voltage level, of global data line pair GIO. Then, equalizing instruction signal φZEQ is activated, whereby equalizing transistor T22 is rendered conductive to equalize the voltages of global data line pair. Finally, the voltages of global data line pair GIO recover to the power-supply voltage Vcc level. The use of load circuit LD allows the transmission of a small amplitude signal in the read operation, and a successful high-speed data read operation is realized.

In the data write operation, however, load circuit LD is deactivated, and data lines GI/O and ZGI/O of global data line pair GIO are driven to the power supply voltage Vcc and ground voltage GND levels. Global data lines GI/O and ZGI/O are charged by MOS transistors T20 and T21 after the completion of the write operation. If the load (parasitic capacitance) of global data lines GI/O and ZGI/O is large, global data lines GI/O and ZGI/O cannot recover to the power-supply voltage Vcc level at a high speed.

Supposing that, after the completion of the data write operation, the data read operation is performed before global data line pair GIO fully recovers to the original voltage level as shown by (A) in FIG. 28, time ta will be required before the voltages of global data line pair GIO are made definite according to the read data. Particularly, a longer time is required when reading data is the inverse of the written data.

On the other hand, when the data read operation is performed after global data line pair GIO recovers to the power supply voltage Vcc as shown by (B) in FIG. 28, the voltage changes from the power supply voltage Vcc according to the read data, and the time required for the voltages of global data line pair GIO to be definite is time tb. Thus, if the write recovery time, or the time required for global data line pair GIO to recover to the original voltage level, is long, the read operation cannot follow the write operation in a short time, which makes high-speed access impossible. Particularly, when write and read operations are performed alternately by using a page mode or the like, a high-speed page operation becomes impossible. In addition, with a clock synchronous semiconductor memory device in which writing and reading of data are performed in synchronization with a clock signal, when data is read after the completion of the write operation and if global data line pair is not allowed to recover fully to the original voltage level within the short clock cycle, data cannot be written or read in synchronization with a high-speed clock (because an attempt to read soon may lead to the reading of incorrect data). Moreover, when data lines are equalized in each clock cycle, the clock cycle cannot be short, and thus, a high-speed write operation cannot be performed.

SUMMARY OF THE INVENTION

An object of the present invention is to provide a semiconductor memory device which allows the access time to be shortened.

Another object of the present invention is to provide a semiconductor memory device which allows a high-speed data read operation.

A further object of the present invention is to provide a semiconductor memory device with a shortened write recovery time.

In one aspect of the present invention, the semiconductor memory device includes a plurality of memory blocks, each having a plurality of memory cells arranged in a matrix of rows and columns and arranged in alignment at least in the column-direction, a plurality of local data line pairs provided corresponding to each memory block and each coupled to a selected memory cell in a corresponding memory block, a global data line pair provided in common to the memory blocks aligned in the column-direction, a plurality of read gate amplifiers provided between the plurality of local data line pairs and the global data line pair for transmitting, in the selected state, a signal from the corresponding local data line pairs to the global data line pair, with the corresponding local data line pairs and the global data line pair electrically isolated, and a current supply load circuit ran coupled to the global data line pair for supplying current of the same magnitude to each data line of global data line pair.

In another aspect, the semiconductor memory device includes an internal data line pair for transmitting internal write data to a selected memory cell, an equalizing circuit coupled to the internal data line pair for equalizing the voltages of the internal data line pair in response to an equalizing instruction signal, and a write circuit for generating internal write data according to the write data from an outside and transmitting the internal write data to the internal data line pair. The write circuit includes a circuit for generating logic-inverted data of the internal write data in response to the activation of the equalizing instruction signal and for transmitting the logic-inverted data to the internal data line pair.

In a further aspect of the present invention, the semiconductor memory device includes a plurality of memory cells arranged in a matrix of rows and columns, a plurality of array blocks disposed corresponding to each memory cell column and including a plurality of bit line pairs having memory cells of corresponding columns connected thereto, a plurality of local data line pairs disposed extending in the row-direction corresponding to each array block, a plurality of column select gates each disposed corresponding to a bit line pair in each of the plurality of array blocks for electrically connecting the bit line pair corresponding to the selected column to the corresponding local data line pair in response to a column select signal, a global data line pair disposed to extend in the column-direction and provided in common to the plurality of array blocks aligned in the column-direction, and a plurality of read gates each provided between each local data line pair and the global data line pair. Each read gate includes a select gate pair made to conduct in response to a block select signal activated in a data read mode, and a differential gate pair receiving at the gates the signal from the corresponding local data line pair. The differential gate pair is formed by a pair of insulated gate field effect transistors. The differential gate pair and the select gate pair are connected in series between the global data line pair and a reference voltage node.

According to this aspect of the present invention, the semiconductor memory device further includes a current mirror-type load circuit coupled to the global data line pair for supplying current to the global data line pair when activated.

A high-speed data read operation is made possible without increasing the area occupied by the circuit, by providing a differential gate pair to each local data line pair and by connecting a load circuit of the current mirror type to the global data line pair.

Moreover, in the equalizing operation, by allowing the transmission of the logic-inverted data of the write data to the internal data line pair, the voltages of the data lines of the internal data line pair can be equalized at a high speed, and the write recovery time required for recovery to a prescribed voltage level after the data write operation is shortened.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic representation of the arrangement of an array portion in the semiconductor memory device according to the first embodiment of the present invention.

DESCRIPTION OF THE PREFERRED EMBODIMENTS

First Embodiment

Figure 2:
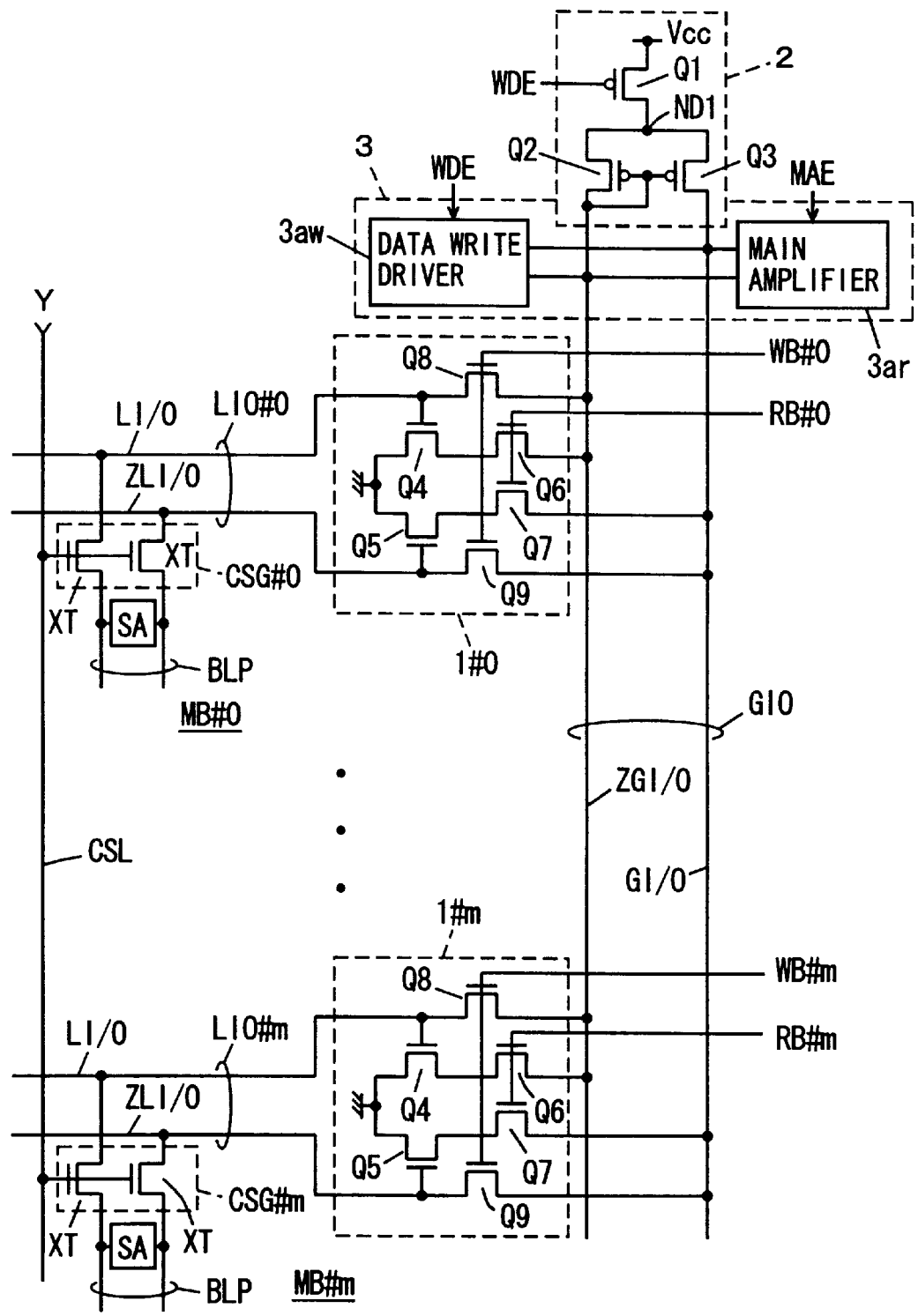
FIG. 2 is a diagram showing in detail the arrangement of the array portion shown in FIG. 1.

FIG. 1 is a schematic representation of the arrangement of an array portion in a semiconductor memory device according to the first embodiment of the present invention. In FIG. 1, memory blocks MB00–MBmn are disposed in a matrix of rows and columns, and each memory block has a plurality of memory cells arranged in a matrix of rows and columns. Memory blocks MBi0–MBin (i=0–m) arranged in alignment in the row-direction form a row block, and memory blocks MB0j–MBmj (j=0–n) arranged in alignment in the column-direction form a column block.

Local data line pairs LIOa-LIOd are disposed corresponding to memory blocks MB00–MBmn. Memory blocks adjacent to each other in the column-direction share a local data line pair located therebetween. Local data line pairs LIOa-LIOd are arranged extending along the corresponding memory blocks in the row-direction. These local data line pairs LIOa–LIOd receive data from and transmit data to only their corresponding memory blocks.

Global data line pairs GIOa-GIOd are disposed in common to the memory blocks (column block) arranged in alignment in the column-direction. In FIG. 1, global data line pairs GIOa and GIOb are disposed for memory blocks MB00–MBm0, and global data line pairs GIOc and GIOd are disposed for memory blocks MB0n–MBmn. The number of global data line pairs disposed corresponding to a column block is arbitrary, and the number of local data line pairs disposed for each memory block is also arbitrary.

Local data line pair LIOa is coupled to global data line pair GIO a via block select/drive circuit 1a, and a block select/drive circuit 1b is disposed between local data line pair LIOb and global data line pair GIOb. Similarly, local data line pair LIOc is coupled to global data line pair GIOc via a block select/drive circuit 1c, and a block select/drive circuit 1d is disposed between local data line pair LIOd and global data line pair GIOd. Block select/drive circuits 1a–1d provided for the memory blocks including a selected row are driven to the selected state. Therefore, in the arrangement shown in FIG. 1, upon selection of a row block, each memory block in a selected row block is coupled through the local data line pairs on either side of the memory block in the column-direction to the global data line pairs disposed on either side of the memory block in the row-direction. Each of block select/drive circuits 1a–1d, whose arrangement will be later described in detail, includes a read amplifier gate for reading data, and a write gate for writing data. The read amplifier gate transmits the signals read out on a corresponding local data line pair to a corresponding global data line pair while the local data line pair is electrically isolated from the corresponding global data line pair. This is realized by forming the read amplifier gate with a comparison stage formed by a field-effect transistor having its gate connected to each respective data line of local data line pair, and a select gate connected in series to the comparison stage and made to conduct in response to a block select signal.

Current mirror-type load circuits 2a–2d for supplying current of the same magnitude to each data line of these global data line pairs when activated are coupled global data line pairs GIOa–GIOd. Thus, in a data read operation, a current mirror-type differential amplifiers are formed by current mirror-type load circuits 2a–2d and differential stages included in block select/drive circuits 1a–1d. For global data line pairs GIOa–GIOd, main amplifiers/write drivers 3a–3d for writing/reading of internal data are provided, respectively. These main amplifiers/write drivers 3a–3d are coupled in common to a main data bus MIOB. The bit width of main data bus MIOB is arbitrary. By selectively activating main amplifiers/write drivers 3a–3d according to a column block select signal, main amplifiers/ write drivers corresponding in number to the width of main data bus MIOB, can be driven to the activate state. Main data bus MIOB is coupled to an input/output buffer circuit 4 for inputting/outputting of external data.

FIG. 2 is a diagram showing in detail the arrangement of the memory array portion shown in FIG. 1. FIG. 2 shows the arrangement of the portion related to one global data line pair GIO. Global data line pair GIO includes data lines GI/O and ZGI/O for transmitting complementary data signals. Global data line pair GIO is provided corresponding to memory blocks MB#0–MB#m. Memory blocks MB#0–MB#m are provided with local data line pairs LIO#0–LIO#m, respectively. Each of the memory blocks MB#0–MB#m includes a bit line pair BLP, a sense amplifier SA for differentially amplifying signals on bit line pair BLP, and a column select gate CSG#i (i=0–m) selectively rendered conductive in response to a column select signal Y on a column select line CSL for connecting sense amplifier SA to the corresponding local data line pair LIO#i (i=0–m).

Each of column select gates CSG#0–CSG#m includes switching transistors XT provided corresponding to respective bit lines of bit line pair BLP, for connecting the corresponding bit lines to local data lines LI/O and ZLI/O in response to column select signal Y. Block select/drive gates 1#0–1#m are provided between the respective local data line pairs LIO#0LIO#m and global data line pair GIO. Block select/dive gates 1#0–#1m have the same configuration. Each of these block select/drive gates 1#0–1#m includes n-channel MOS transistors Q8 and Q9 made to conduct in response to a write block select signal WB#i (i=0–m) for connecting global data lines GI/O and ZGI/O to local data lines ZLI/O and LI/O, respectively, n-channel MOS transistors Q4 and Q5 having their respective gates connected to local data lines LI/O and ZLI/O, and n-channel MOS transistors Q6 and Q7 made to conduct in response to a read block select signal RB#i for electrically connecting MOS transistors Q4 and Q5 to global data lines ZGI/O and GI/O. The sources of MOS transistors Q4 and Q5 are connected to the ground node.

A load circuit 2 includes a p-channel MOS transistor Q1 which is connected between a power supply node for supplying the power supply voltage Vcc and a node ND1 to receive at its gate a write driver activating signal WDE, a p-channel MOS transistor Q3 which is connected between node ND1 and global data line GI/O and has a gate connected to global data line GI/O, and a p-channel MOS transistor Q2 which is connected between node ND1 and global data line ZGI/O and has a gate connected to global data line ZGI/O. MOS transistors Q2 and Q3 of load circuit 2 form a current mirror circuit which supplies currents of the same magnitude to global data lines GI/O and ZGI/O.

Main amplifier/write driver 3 includes a main amplifier 3ar which is activated in response to the activation of a main amplifier activating signal MAE to amplify the voltages on global data line pair GIO, and a data write driver 3aw which is activated in response to the activation of a write driver activating signal DWE to drive global data line pair GIO according to an internal write data provided by input/output buffer circuit 4 shown in FIG. 1. Now, the data read operation of the arrangement shown in FIG. 2 will be described with reference to the signal waveform diagram shown in FIG. 3.

First, a word line in a selected row block is driven to the selected state according to a row address signal. Since the data write/read mode is not yet specified at this time, a row block select signal RB#i is at a logic "L" level or in a non-selected state, and block select/drive gates 1#0–1#m are all in the inactive state.

When a word line is selected, the data of a memory cell connected to the selected word line is read out to a bit line, changing the potential of the bit line pair. Sense amplifier SA is activated at a prescribed timing, the voltages of bit line pair BLP are driven to and held at the power supply voltage Vcc and ground voltage level, according to the selected memory cell data.

Then, a column address signal is provided, causing column select signal Y for selecting an addressed column to be driven to the selected state or a logic "H" level. In response to the logic "H" level of column select signal Y, column select gates CSG#0–CSG#m provided corresponding to the addressed column are rendered conductive, and bit line pair BLP is connected to each respective one of local data line pairs LIO#0–LIO#m. In a non-selected memory block, the word line is in the non-selected state. Further, a bit line equalizing circuit is in the active state, and each bit line pair BLP is being precharged to a precharge voltage level (at Vcc/2). Thus, although the column selection is performed in the non-selected memory block, there is no change in the voltage of the local data line pair (the precharge voltage of local data line pair LIO is at the level of Vcc/2).

In this case, read block select signals RB#0–RB#m are all still in the inactive state or at the logic "L" level, and block select/drive gates 1#0–1#m are inactive. Consequently, even when the data from sense amplifier SA is transferred to local data line pair LIO, the voltage levels of global data line pair GIO do not change since MOS transistors Q6 and Q7 included in block select/drive gates 1#0–1#m are in the non-conductive state.

Then, read block select signal RB#i for the selected row block is driven to the logic "H" level or the active state according to a data read mode instruction signal, thereby rendering conductive MOS transistors Q6 and Q7 of the read gate amplifier of block select/drive gate 1#i provided for the selected row block. Then, MOS transistors Q4 and Q5 forming a differential stage are coupled to global data line pair GIO. In block select/drive gate 1#i for the selected row block, the corresponding local data lines LI/O and ZLI/O are driven by sense amplifier SA and have their voltage levels changed. In the read gate amplifier, since the gate voltages of MOS transistors Q4 and Q5 differ from each other, the conductance of MOS transistor coupled to the local data line at a higher potential of local data lines LI/O and ZLI/O increases, and the voltage level of the corresponding global data line is lowered.

In load circuit 2, MOS transistor Q1 is conductive, and current is supplied from the power supply node via MOS transistors Q2 and Q3. Thus, in block select/drive gate 1#i for the selected row block, a current mirror-type differential amplifier circuit is formed by load circuit 2 and the ea read gate amplifier (MOS transistors Q4–Q7), and the voltage levels of global data lines GI/O and ZGI/O change at a high speed.

Then, the activation of main amplifier activating signal MAE causes the activation of main amplifier 3ar which in turn further amplifies the voltages of global data line pair GIO and transmits the amplified voltages on the main data line pair.

Sense amplifier SA provided for the selected column is only required to drive the local data lines. The global data line pair is driven by a current mirror-type differential amplifier circuit comprised of current mirror-type load circuit 2 and MOS transistors Q4 and Q5 forming the differential stage included in the block select/drive gate. Therefore, the local data line pair and the global data line pair need not be driven by a single sense amplifier, so that the voltage levels of global data line pair GIO can be changed according to a selected memory cell data at a high speed, which allows a high-speed read operation.

In addition, in current mirror-type load circuits 2, when each of the data lines GI/O and ZGI/O of global data line pair GIO attains the power supply voltage Vcc level, MOS transistors Q2 and Q3 forming the current mirror circuit become non-conductive. As a result, the amount of consumed current can be reduced since the current is only consumed when a voltage level of the global data line pair changes in the data read operation.

Moreover, in block select/drive gates 1#0–1#m, MOS transistors Q6 and Q7 responsive to read block select signal RB#i cause MOS transistors Q4 and Q5 forming a comparison stage (differential stage) to operate in the unsaturated region by channel resistance, changing the current at a high speed according to the voltage levels of the corresponding local data lines LI/O and ZLI/O, thereby improving the sensitivity of the current mirror-type differential amplifier. Furthermore, the path for the current to flow in the read gate amplifier is formed only while read block select signal RB#i is activated so that current consumption of the current mirror-type differential amplifier circuit can be reduced. Thus, by connecting MOS transistors Q6 and Q7 which receive at their gates read block select signal RB#i and MOS transistors Q4 and Q5 forming the differential stage in series, the operation of the current mirror-type differential amplifier circuit formed by current mirror-type load circuit 2 and the read gate amplifiers (MOS transistors Q4–Q7) can be optimized.

Figure 3:
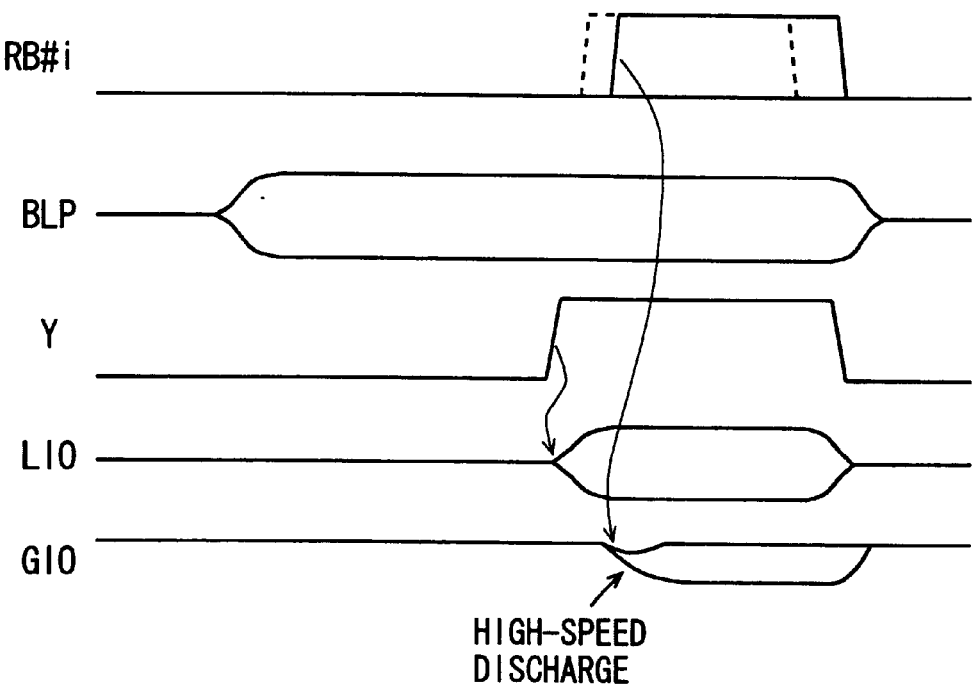
FIG. 3 is a signal waveform diagram representing the data read operation of the arrangement shown in FIG. 2.
Figure 4:
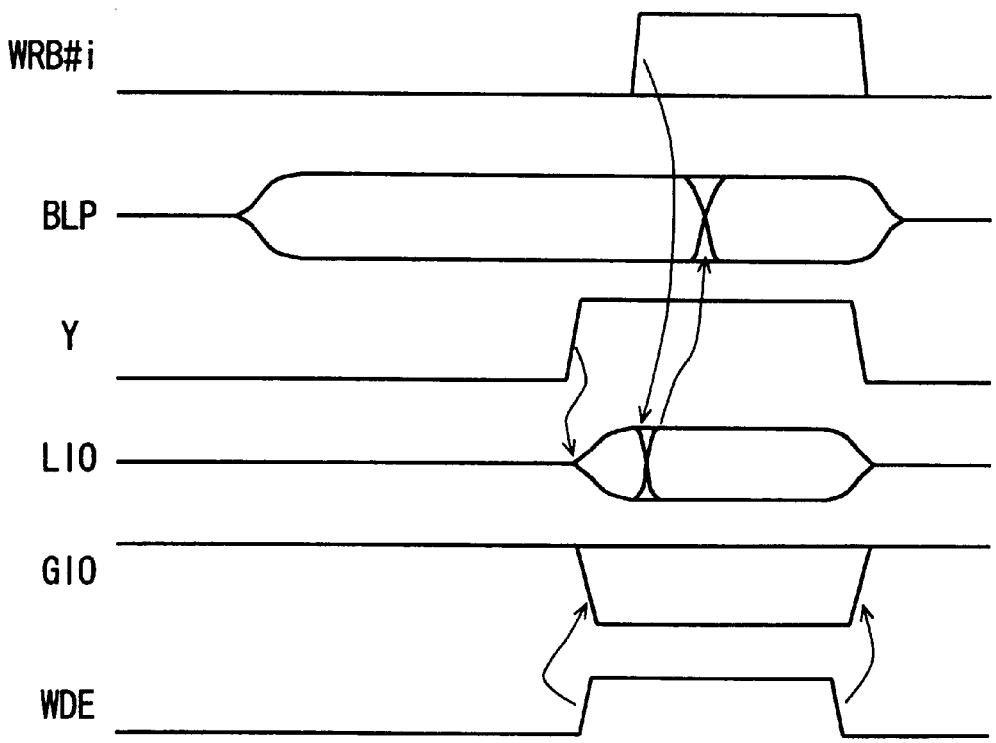
FIG. 4 is a signal waveform diagram representing the data write operation of the arrangement shown in FIG. 2.

Further, as shown by the dotted line in FIG. 3, read block select signal RB#i may be driven to the selected state almost at the same time as the activation of column select signal Y, and may be driven to the inactive state at an earlier timing than deactivation of column select signal Y. Row block select signal RB#i is preferably driven to the selected state when the voltage difference of local data line pair LIO becomes sufficiently large, in order to prevent the differential stage (MOS transistors Q4 and Q5) at local data line pair LIO from operating incorrectly. Now, the data write operation will be described with reference to FIG. 4.

In the data write operation, a word line (not shown) is first driven to the selected state according to a row address signal, and the data of a memory cell connected to the selected word line is transmitted on bit line pair BLP (data is read out on one of the bit lines, while the other bit line maintains the precharge voltage level).

Then, the column selecting operation is performed according to a column address signal. Column select signal Y corresponding to the addressed column is driven to the selected state, and bit line pair BLP corresponding to the selected column is connected to the corresponding local data line pair LIO. The voltage levels of local data line pair LIO change according to the data latched by sense amplifier SA.

Thereafter, write driver activating signal WDE is driven to the active state, and global data line pair GIO is driven to the voltage level corresponding to the write data by a data write driver 3aw. At this time, in current mirror-type load circuit 2, a current source MOS transistor Q1 becomes non-conductive according to write driver activating signal WDE, and the current supplying operation to global data lines GI/O and ZGI/O is stopped. In this manner, write data is transmitted at a high speed from data write driver 3aw to global data line pair GIO. When the write data is transmitted to global data line pair GIO, a write block select signal WB#i is driven to the selected state or the logic "H" level. The write gate (MOS transistors Q8 and Q9) for the selected memory block becomes conductive, and global data line pair GIO and local data line pair LIO are connected. Then, the voltages of local data line pair LIO change according to the internal write data from data write driver 3aw. The voltages of local data line pair LIO are transmitted via a column select gate CSG#i to the selected bit line pair BLP, and the voltage levels of bit line pair BLP change according to the write data. The current drivability of data write driver 3aw is sufficiently large so that a data write operation can be performed at a high speed.

Figure 5:
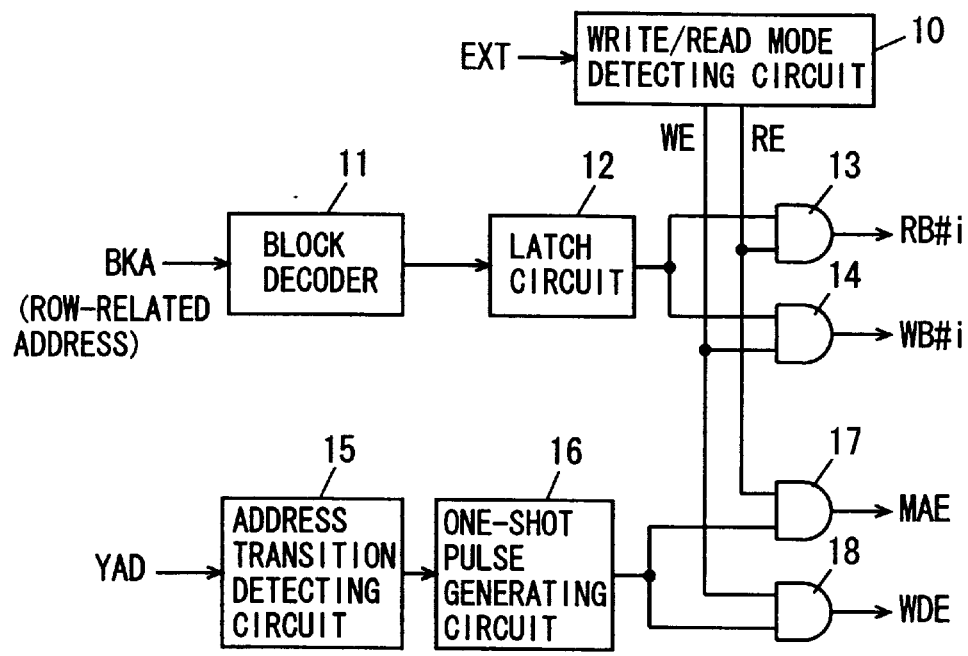
FIG. 5 is a schematic representation of a portion for generating control signals in the arrangement shown in FIG. 2.

FIG. 5 is a schematic representation of the arrangement of the portion for generating each control signal shown in FIG. 2. In FIG. 5, the control signal generating portion includes a write/read mode detecting circuit 10 for detecting whether the operation mode is applied the write or read mode according to a control signal EXT externally provided, a block decoder 11 for decoding a block address signal BKA applied along with a row address to generate a block select signal specifying a row block including a selected word line, a latch circuit 12 for latching an output signal of block decoder 11, an AND circuit 13 for receiving an output signal from latch circuit 12 and a read operation instruction signal RE from write/read mode detecting circuit 10 to generate a write block select signal RB#i, an AND circuit 14 for receiving an output signal from latch circuit 12 and a write operation instruction signal WE from wlite/read mode detecting circuit 10 to generate a write block select signal WB#i, an address transition detecting circuit 15 for detecting the transition in a column address signal YAD, a one-shot pulse generating circuit 16 for generating a one-shot pulse signal having a prescribed time width in response to an address transition detecting signal output from address transition detecting circuit 15, an AND circuit 17 for receiving read operation instruction signal RE and a one-shot pulse from one-shot pulse generating circuit 16 to output a main amplifier activating signal MAP, and an AND circuit 18 for receiving write operation instruction signal WE and a one-shot pulse from one-shot pulse generating circuit 16 to generate a write driver activating signal WDE.

The arrangement of write/read mode detecting circuit 10 used in a synchronous semiconductor memory device which operates in synchronization with a clock signal is different from that used in a general clock asynchronous memory device which operates according to row address strobe signal /RAS and column address strobe signal /CAS without using a clock signal. In the case of the synchronous semiconductor memory device, external control signal EXT is provided in the form of a command. Therefore, write/read mode detecting circuit 10 decodes the command provided in synchronization with the clock signal, determines from the decoded result whether the command is a read command instructing a data read operation or a write command instruction a data write operation, and selectively drives read operation instruction signal RE or write operation instruction signal WE to the active state. In the case of the clock asynchronous semiconductor memory device, write/read mode detecting circuit 10 receives a column address strobe signal /CAS and a write enable signal /WE as external control signal EXT, and activates read operation instruction signal RE or write operation instruction signal WE according to the state of write enable signal /WE.

Block decoder 11 decodes block address signal BKA applied along with the row address signal and generates a signal specifying a row block including the selected word line. Latch circuit 12 latches a row block select signal output from block decoder 11. Either read row block select signal RB#i or write row block select signal WB#i is driven to the selected state according to read operation instruction signal RE or write operation instruction signal WE from write/read mode detecting circuit 10. Thus, even if the block address signal is applied at the same time as the row address signal, row block select signal RB#i/WB#i can be driven to the selected state during the column select operation (column access).

Address transition detecting circuit 15 detects the transition in column address signal YAD and outputs a one-shot pulse signal (ATD signal), and one-shot pulse generating circuit 16 generates a one-shot pulse signal at a prescribed timing in response to the ATD signal. Thus, either main amplifier activating signal MAE or write driver activating signal WDE is activated according to the read mode or the write mode, thereby allowing the data read/write operation.

In the case of the clock synchronous semiconductor memory device, if read operation instruction signal RE or write operation instruction signal WE is activated for the period of a burst length (number of clock cycles corresponding to the number of data successively read out by one command), one-shot pulse generating circuit 16, instead of the address transition detecting circuit 15, may generate a one-shot pulse according to the change in clock signal CLK in response to the activation of read operation instruction signal RE or write operation instruction signal WE.

Moreover, in the arrangement shown in FIG. 2, a sense amplifier SA is provided to each memory block. A shared sense amplifier shared by the adjacent memory blocks (in the column-direction) may be used as sense amplifier SA instead. In addition, each unit of a plurality of row blocks may be formed into a bank.

Further, block address BKA may be applied in the column select operation.

Figure 6:
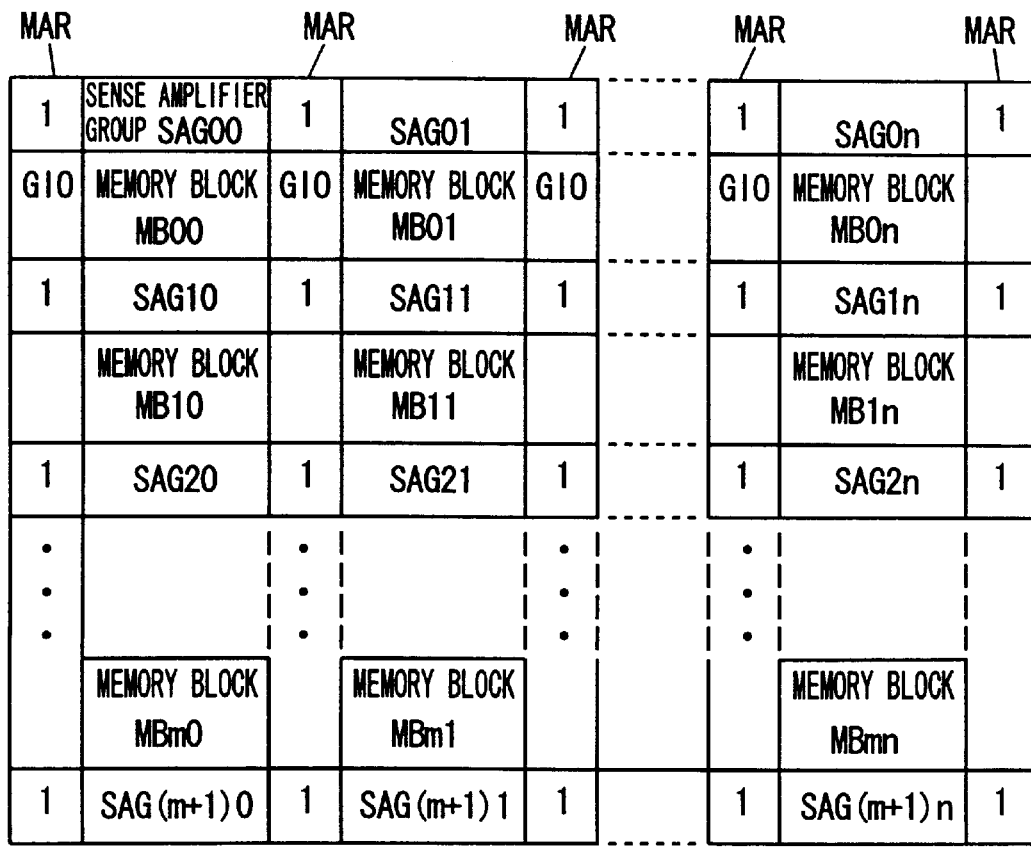
FIG. 6 shows a schematic layout of the array portion according to the first embodiment of the present invention.

FIG. 6 is a schematic representation of a memory array layout according to the first embodiment of the present invention. In FIG. 6, the memory array is divided into a plurality of memory blocks MB00–MBmn. For these memory blocks MB00–MBmn, sense amplifier groups SAG00–SAG (m+1)n each including a plurality of sense amplifiers are provided. The sense amplifier group disposed between two adjacent memory blocks in the column-direction are shared by these memory blocks. A block select/drive gate 1 is disposed between the adjacent sense amplifier groups in the row-direction. Global data line pairs GIO are arranged extending in the column-direction. Memory cells are not disposed in inter-block regions MAR (including the regions outside the memory blocks) where these global data line pairs GIO are provided. Region MAR is a word line shunt region or a region in which a sub-word line drive circuit is arranged. The word line shunt region is the region in which a polysilicon word line forming the agate of an access transistor is electrically contacted with a low resistance aluminum interconnection line in the layer above the polysilicon word line. When the sub-word line drive circuit is disposed, the word lines are divided into global word lines and local word lines to which memory cells are actually connected in the memory blocks. Block select/drive gate 1 can be disposed in alignment with the sense amplifier group, and the region between the sense amplifier groups is a free area in which only interconnection lines are arranged.

Thus, the block select/drive gate can be arranged with sufficient margin. In this arrangement, data can be read at a high speed without any increase in the area occupied by the array.

In the arrangement shown in FIG. 6, block select/drive gates are provided on either side of the sense amplifier group. Block select/drive gate 1, however, may be disposed alternately on either side of a sense amplifier group SAG in the column-direction. By utilizing this alternate arrangement, block select gates for memory blocks on either side can be alternately disposed, which allows the block select/drive gates to be arranged with sufficient margin even when a plurality of block select/drive gates are disposed in the region between the sense amplifier groups.

Any number of global data line pairs GIO may be disposed in inter-memory block region MAR.

First Modification

Figure 7:
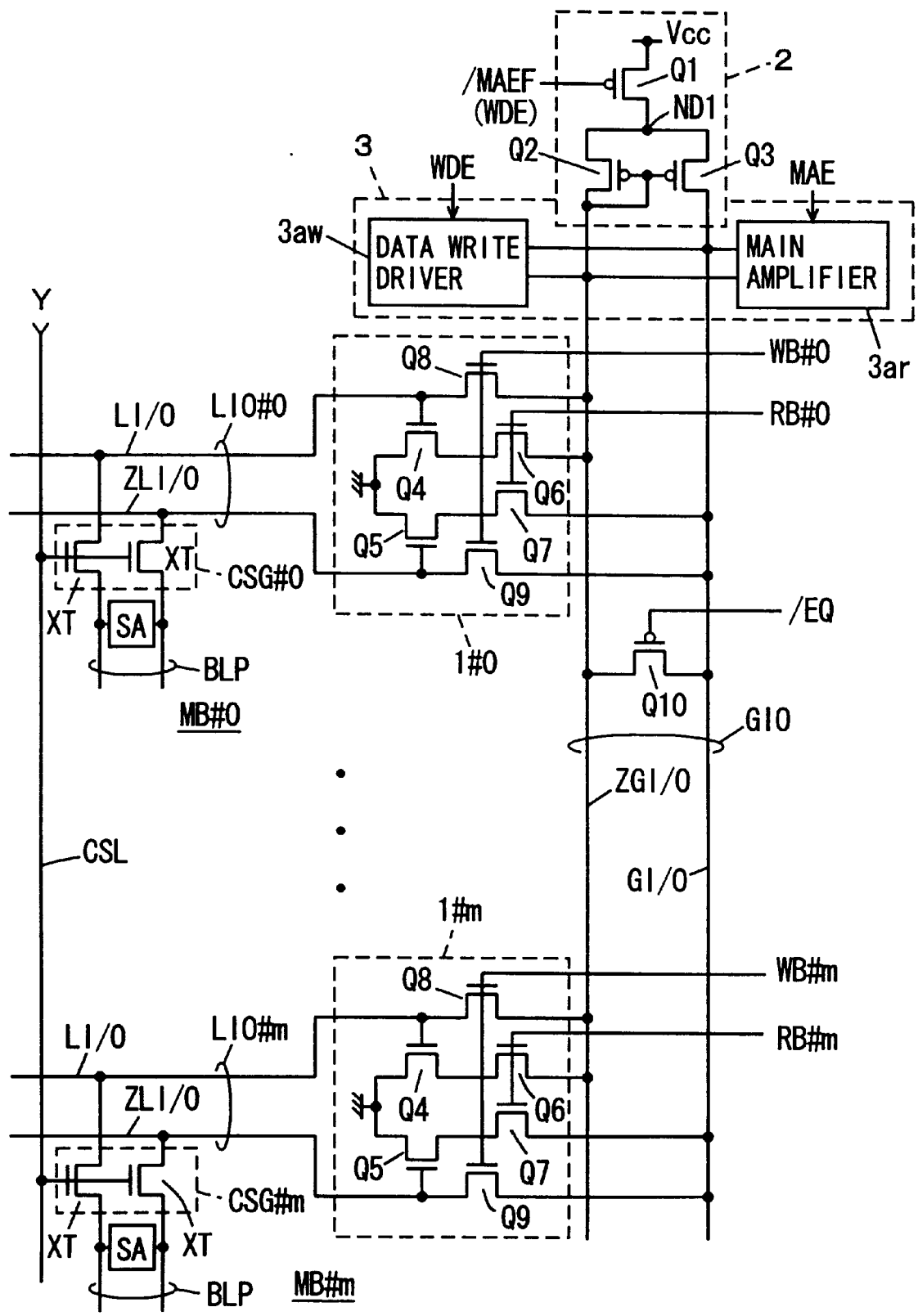
FIG. 7 is a diagram representing the arrangement of a modification of the first embodiment of the present invention.

FIG. 7 is a diagram showing the arrangement of a modification of the first embodiment of the present invention. In a current mirror-type load circuit 2 in the arrangement shown in FIG. 7, an activating signal /MAEF which is activated at a faster timing than main amplifier activating signal MAE is used as a control signal. In addition, between global data lines GI/O and ZGI/O an equalizing transistor Q10 is provided which is formed by a p-channel MOS transistor and made to conduct in response to the activation of an equalizing instruction signal /EQ to electrically short-circuit these global data lines ZGI/O and GI/O. Other arrangements are identical to the ones shown in FIG. 2, and corresponding parts are designated by the same reference characters.

In the data read operation, activating signal /MAEF is first activated, and current mirror-type load circuit 2 is activated. Equalizing instruction signal EQ attains the logic "H" level in response to the transition in the column address signal and equalizing transistor Q10 becomes non-conductive. Consequently, current flows through global data lines GI/O and ZGI/O and current flows from current mirror-type load circuit 2 via the selected block select/dive gate, thereby creating a voltage difference on global data line pair GI/O.

When data read operation is completed, main amplifier activating signal MAE becomes inactive, and then activating signal /MAEF attains the logic "H" level and current mirror-type load circuit 2 becomes inactive. Moreover, equalizing instruction signal /EQ is activated or attains the logic "L" level, and the voltages of global data lines GI/O and ZGI/O are equalized. In this manner, it is possible to bring back the voltage level to the original level at a high speed after the completion of the data read operation.

Since current mirror-type load circuit 2 maintains its inactive state during the data write operation, it does not affect the data write operation in any way. Equalizing transistor Q11 becomes inactive in response to the deactivation of equalizing instruction signal /EQ, and thereafter, data write driver 3aw is activated and generates internal write data. The internal write data on global data lines GI/O and ZGI/O are transmitted via the block select/drive gate to local data line pair LIO provided for the selected memory block, and is written into the selected memory cell.

Upon completion of the data write operation, write driver activating signal WDE is deactivated, and then, equalizing instruction signal /EQ is driven to the active state or the logic "L" level. Thus, global data lines GI/O and ZGI/O at the logic "H" level and the logic "L" level and having an amplitude of the power supply voltage Vcc level through the operation of data write driver 3aw can be driven once again at a high speed by equalizing transistor Q10. Thereafter, a pull-up transistor, not shown, raises global data line pair GIO to the power supply voltage Vcc level. In this manner, the voltages of global data line pair GIO can be recovered to the original precharge voltage level at a high speed after the data write operation.

Moreover, if write driver activating signal WDE is applied as a control signal to current mirror-type load circuit 2, the pull-up element of global data line pair GIO is no longer required. Current mirror-type load circuit 2 can be utilized as the pull-up element for the global data line pair, which as a result leads to a higher speed equalizing operation. When equalizing transistor Q10 is in the conductive state, and when global data lines GI/O and ZGI/O are charged to the power supply voltage Vcc level by current mirror-type load circuit 2, MOS transistors Q2 and Q3 in current mirror-type load circuit 2 are turned off. Thus, even when current mirror-type load circuit 2 is deactivated only during the data write operation, current consumed by current mirror-type load circuit 2 can be reduced by equalizing transistor Q10 (because MOS transistors Q2 and Q3 are both turned off in the standby state).

Figure 8:
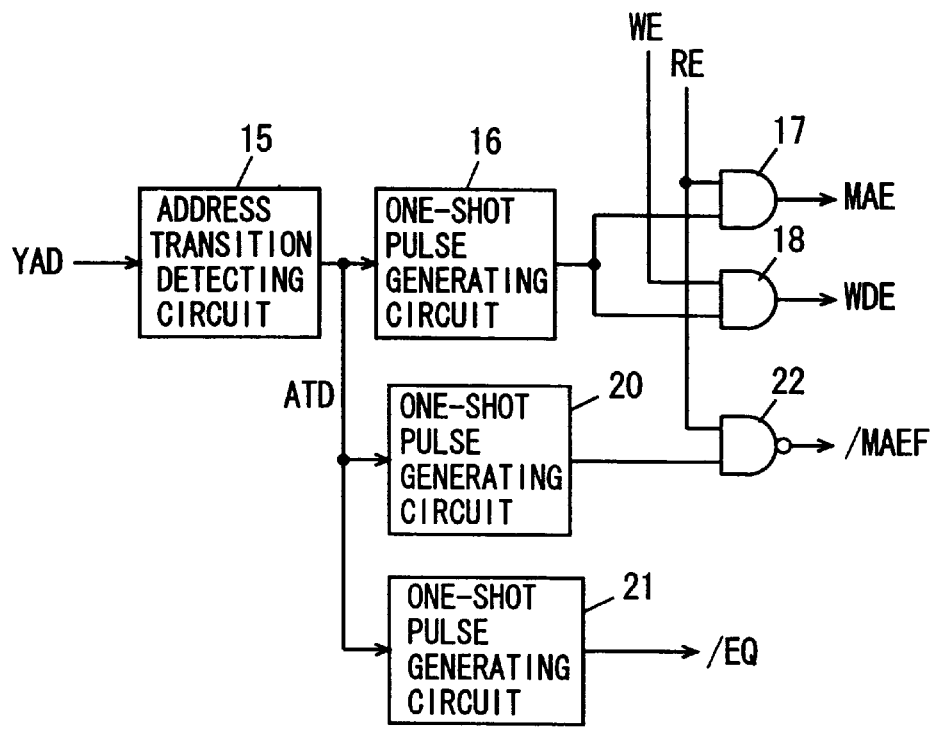
FIG. 8 is a schematic representation of a portion for generating control signals in the arrangement shown in FIG. 7.

FIG. 8 is a diagram showing the arrangement of the portion for generating the control signal shown in FIG. 7. In FIG. 8, the control signal generating portion includes, in addition to the arrangement shown in FIG. 5, a one-shot pulse generating circuit 20 for generating a one-shot pulse signal which is at the logic "H" level for a prescribed period in response to the activation of an address transition detecting signal ATD from an address transition detecting circuit 15, a one-shot pulse generating circuit 21 for generating a one-shot pulse signal having a prescribed time width in response to the activation of address transition detecting signal ATD from address change detecting circuit 15 and outputting an equalizing instruction signal /EQ, an NAND circuit 22 receiving an output signal of one-shot pulse generating circuit 20 and a read operation instruction signal RE to output an activating signal /MAEF. Read operation instruction signal RE and write operation instruction signal WE are generated from write/read mode detecting circuit 10 shown in FIG. 5.

Figure 9:
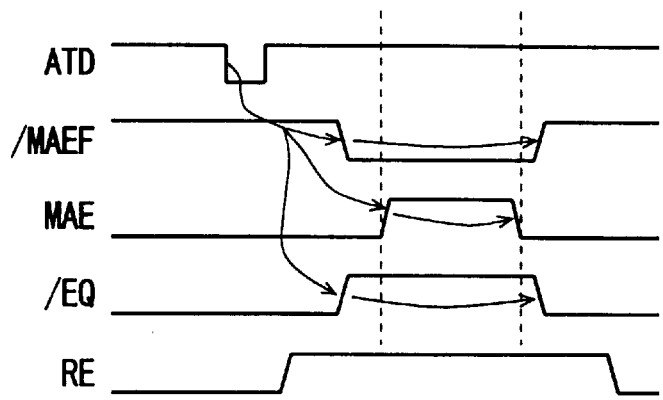
FIG. 9 is a signal waveform diagram representing the operation of the circuit shown in FIG. 8.

Now, the operation of the control signal generating portion shown in FIG. 8 will be described with reference to the signal waveform diagram shown in FIG. 9.

When column address signal YAD makes a transition, address transition detecting signal ATD from address transition detecting circuit 15 is set in the active state or at the logic "L" level for a prescribed period. Accordingly, one-shot pulse generating circuits 20 and 21 each generate, at a prescribed timing, the pulse signals which are to attain the logic "H" level. Read operation instruction signal RE is set in the active state or at the logic "H" level for a prescribed period according application of the column address signal. (In the case of the clock synchronous semiconductor memory device, a read command instructing a data read operation is applied at the same time as the column address signal, and read operation instruction signal RE is set at the logic "H" level for the period of the burst length in response to the command.)

The pulse signal from one-shot pulse generating circuit 21 is used as equalizing instruction signal /EQ; therefore, the equalizing operation of the global data line pair is interrupted for a prescribed period. Then, the output pulse signal of one-shot pulse signal 20 attains the logic "H" level, and activating signal /MAEF output from NAND circuit 22 attains the logic "L" level, whereby current mirror-type load circuit 2 is activated. Thereafter, the pulse signal from one-shot pulse generating circuit 16 attains the logic "H" level, and main amplifier activating signal MAE is activated. When main amplifier activating signal MAE changes from the active state to the inactive state, equalizing instruction signal /EQ attains the logic "L" level while activating signal /MAEF attains the logic "H" level, leading once again to the equalizing operation of the global data line pair.

Figure 10:
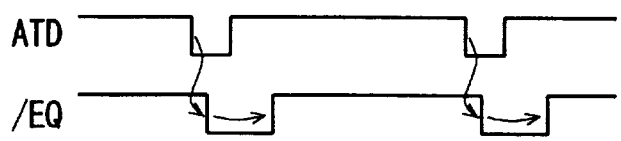
FIG. 10 is a diagram showing another manner of generating an equalizing instruction signal in the circuit shown in FIG. 8.

FIG. 10 is a diagram representing the operation of the variation of one-shot pulse generating circuit 21 shown in FIG. 8. One-shot pulse generating circuit 21 in the arrangement shown-in FIG. 10 generates a pulse signal which remains at the logic "V" level for a prescribed period in response to the activation of address transition detecting signal ATD from address transition detecting circuit 15. Thus, equalizing instruction signal /EQ remains in the active state for a prescribed period in response to the activation of address transition detecting signal ATD. With the arrangement in which the address transition detecting signal ATD becomes activated in response to the change caused even when an address buffer is reset, address transition detecting signal ATD can equalize the global data line pair for a prescribed period upon each transition of the column address and also after the completion of the access operation. Any of the arrangements of FIG. 9 or FIG. 10 may be used for generation of equalizing instruction signal /EQ as long as the equalizing operation does not affect the data write or read operation.

Second Modification

Figure 11:
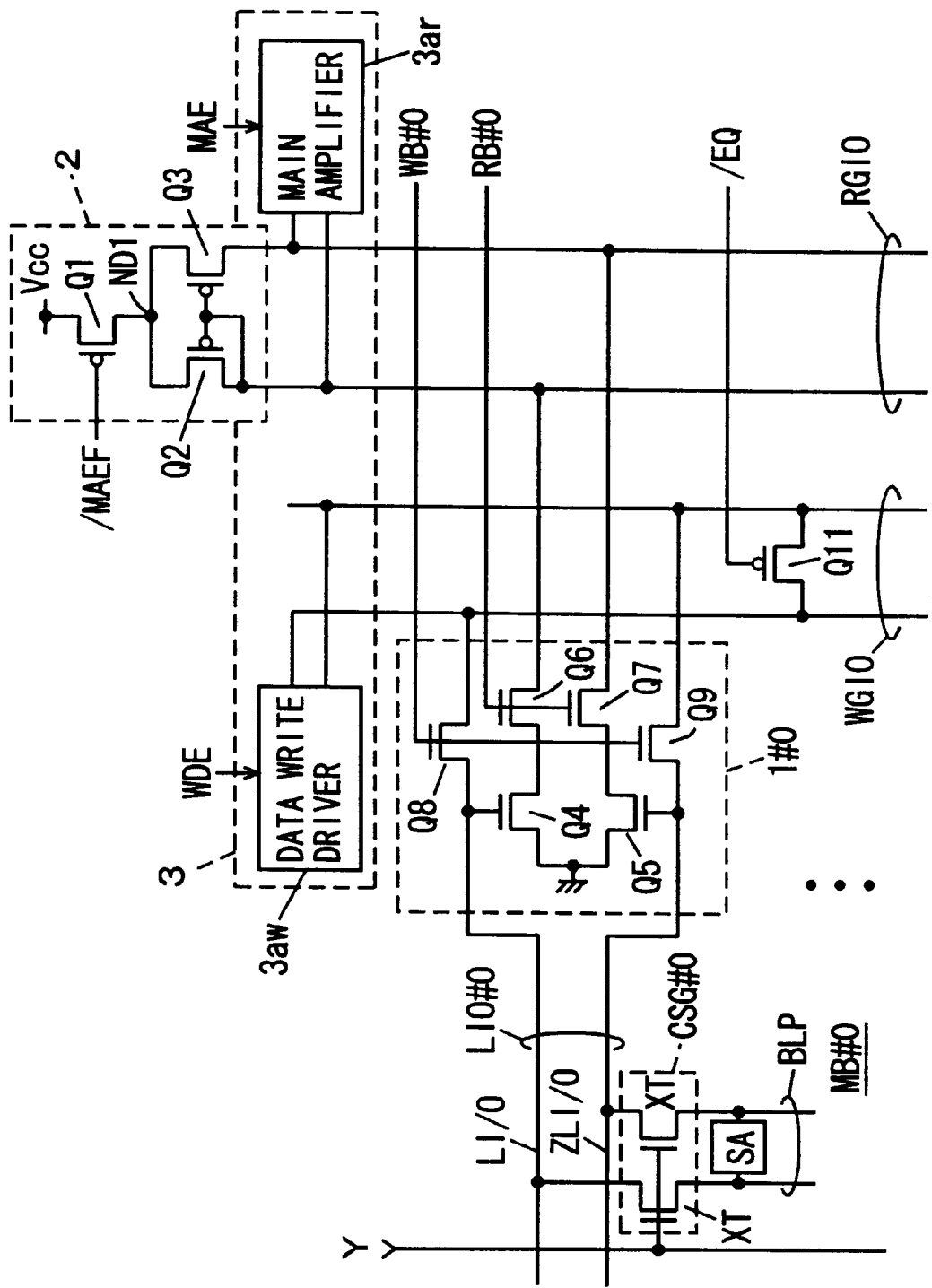
FIG. 11 is a schematic representation of the arrangement of a second modification of the first embodiment of the present invention.

FIG. 11 is a diagram showing the arrangement of the second modification of the first embodiment of the present invention. FIG. 11 shows the arrangement of the portion related to one memory block. In the arrangement shown in FIG. 11, a read global data line pair RGO for transmitting read data and a write global data line pair WGI for transmitting write data are provided separately. A current mirror-type load circuit 2 and a main amplifier 3ar are coupled to read global data line pair RGO. A data write diver 3aw is coupled to write global data line pair WGI.

At block select/drive gate 1#0, MOS transistors Q8 and Q9 which serve as a write gate are connected to write global data line pair WGI. In addition, MOS transistors Q6 and Q7 forming a read gate amplifier are coupled to read global data line pair RGO. Further, an equalizing transistor (p-channel MOS transistor) Q11 rendered conductive in response to equalizing instruction signal /EQ is provided to write global data line pair WGI.

In the arrangement shown in FIG. 11, write data and read data are transmitted through separate data line pairs of the global data line pairs. On the other hand, local data line pair LIO transmits both write data and read data. Even in such an arrangement, the sense amplifier is only required to drive local data line pair LIO in the data read operation. Read global data line pair RGO is driven by a current mirror-type differential amplifier circuit formed by current mirror-type load circuit 2 and a read gate amplifier included in the block select/drive gate. Thus, read data can be transmitted to main amplifier 3ar at a high speed.

Further, equalizing transistor Q11 is provided to global data line pair WGI in order to allow the voltage, discharged to the ground voltage level after the data write operation, to recover to the original precharge voltage level at a high speed. Since current mirror-type load circuit 2 operates as a pull-up element, read data global data line pair RGO is precharged to the power-supply voltage Vcc level at a high speed.

Furthermore, in the arrangement in which read and write operations are separated, since write data is not transmitted on read global data line pair, current mirror-type load circuit 2 can be in operation at all times. Thus, MOS transistor Q1 is no longer required, and MOS transistors Q2 and Q3 may be connected to the power supply node. In addition, local data line pairs LIO may be divided into read local data line pairs dedicated for read data and write local data line pairs for transmitting write data which corresponds to read global data line pairs RGO and write global data line pairs WGI, respectively.

As seen from above, according to the first embodiment of the present invention, the block select gate connecting the local data line pair and the global data line pair is provided with a differential-amplifying read gate amplifier. As a result, a high-speed data read operation is achieved without increasing the array area.

Moreover, differential stage MOS transistor gates connected to respective local data lines is connected in series with MOS transistors receiving at their gates a block select signal to form the read gate amplifier. Consequently, the MOS transistors for the select gate can optimize the operation of the differential amplifier circuit. Moreover, since current is consumed for only the minimum required period, a read gate amplifier which operates at a high speed and consumes only a small amount of current is realized.

Further, an equalizing transistor may be provided between the node connecting MOS transistors Q4 and Q6 and the node connecting MOS transistors Q5 and Q7 in the read gate amplifier. The voltage of the read gate amplifier at the beginning of the operation can be set at a prescribed level at all times.

Second Embodiment

Figure 12:
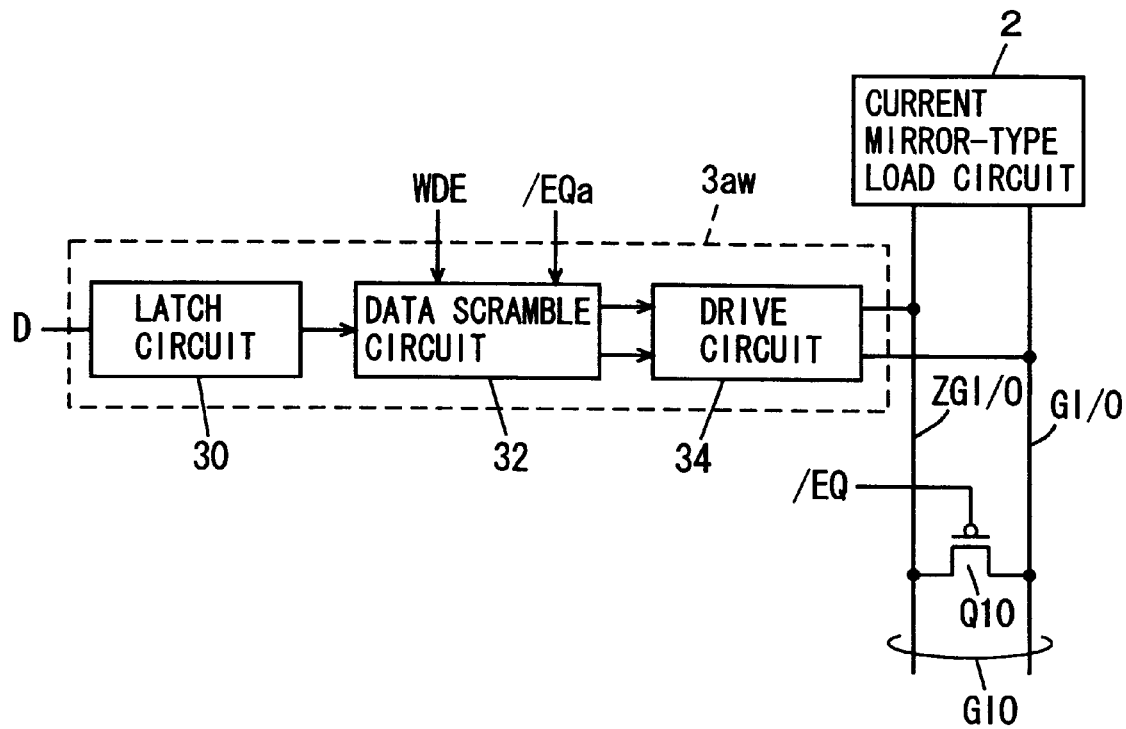
FIG. 12 is a schematic representation of the arrangement of a main portion of the semiconductor memory device according to a second embodiment of the present invention.

FIG. 12 is a diagram showing the arrangement of a main portion of the semiconductor memory device according to the second embodiment of the present invention. FIG. 12 shows the arrangement of a data write driver 3aw. In FIG. 12, data write driver 3aw includes a latch circuit 30 for latching internal write data D, a data scramble circuit 32 for inverting the manner of data according to write driver activating signal WDE and equalizing instruction signal /EQ to generate complementary data according to the internal data from latch circuit 30, and a drive circuit 34 for driving each of the data lines GI/O and ZGI/O of global data line pair GIO according to the complementary data output from data scramble circuit 32.

Data scramble circuit 32 generates complementary data according to the data received from latch circuit 30 when write driver activating signal WDE is in the active state and when equalizing instruction signal /EQ is in the inactive state. On the other hand, when write driver activating signal WDE is in the inactive state and when equalizing instruction signal /EQ is in the active state, data scramble circuit 32 inverts the logic levels of the output data of the latch circuit 30, generates the complementary data, and outputs the generated complementary data. Drive circuit 34 drives global data lines GI/O and ZGI/O according to the output data from data scramble circuit 32. Thus, when the write operation is completed and equalizing instruction signal /EQ is activated or attains the logic "L" level, equalizing transistor Q10 is rendered conductive and drive circuit 34 drives global data lines GI/O and ZGI/O in the direction opposite to the direction in which they were driven during the write operation. In this way, the time required for the equalization of the global data lines is reduced.

Figure 13:
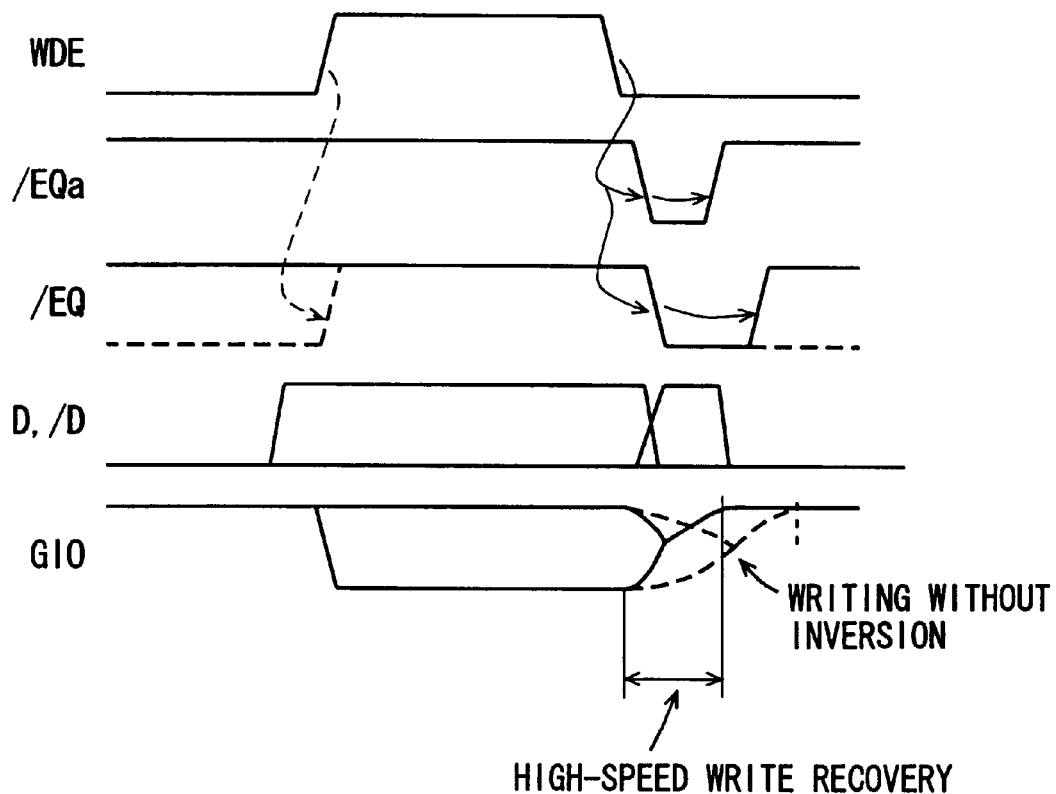
FIG. 13 is a signal waveform diagram representing the operation of a data write buffer shown in FIG. 12.

As shown in FIG. 13, when write driver activating signal WDE is activated, data scramble circuit 32 generates complementary write data according to the data received from latch circuit 30. Equalizing instruction signal /EQ is in the inactive state or at the logic "H" level, and MOS transistor Q10 is in the non-conductive state. Drive circuit 34 drives global data lines GI/O and ZGI/O according to the data from data scramble circuit 32. Thus, of the global data lines, the data line receiving the logic "L" level data is driven to the ground voltage level, while the other data line maintains the precharged power-supply voltage level.

When write driver activating signal WDE is deactivated, equalizing instruction signal /EQ is not at the logic "L" level or in the active state for a prescribed period, and MOS transistor Q10 is rendered conductive to electrically short-circuit global data lines GI/O and ZGI/O. In this manner, the voltage levels of the global data lines are equalized. At this time, data scramble circuit 32 also generates logic-inverted write data of the write data in response to the activation of equalizing instruction signal (data inverting instruction signal) /EQa and applies the generated logic-inverted data to drive circuit 34. Thus, in global data lines GI/O and ZGI/O, the data line at the logic "H" level is driven toward the logic "L" level, the global data line at the logic "L" level is driven toward the logic "H" level, and the equalization of the voltages of global data lines GI/O and ZGI/O becomes faster. The voltage levels of global data lines GI/O and ZGI/O are equalized, followed by driving to the power-supply voltage Vcc level by current mirror-type load circuit 2. By allowing the inverted data to be written in the equalizing operation after the write operation is completed, the voltage levels of the global data lines can be driven in the opposite directions at a higher speed than when only MOS transistor Q10 is used for the equalizing operation. Moreover, the equalization time can be shortened, and write recovery can be achieved at a higher speed. Consequently, the cycle time is reduced, and a high speed access becomes possible.

When data is written by a page mode or the like, the so-called CAS precharge time can be shortened (the time required to precharge global data lines can be reduced). Thus, a high-speed write operation is achieved.

Moreover, when data is written in synchronization with a clock signal as in a dock synchronous semiconductor memory device, the time required to precharge the global data lines can be reduced, and data can be written in synchronization with a high-speed clock signal in the data write cycle.

Furthermore, equalizing instruction signal /EQ may be made to be at the logic "H" level or the inactive state only when write driver activating signal WDE is in the active state, as shown by the dotted lines in FIG. 13. Instruction signal /EQa is used in order to prevent the global data lines from being overdriven during equalization.

Figure 14:
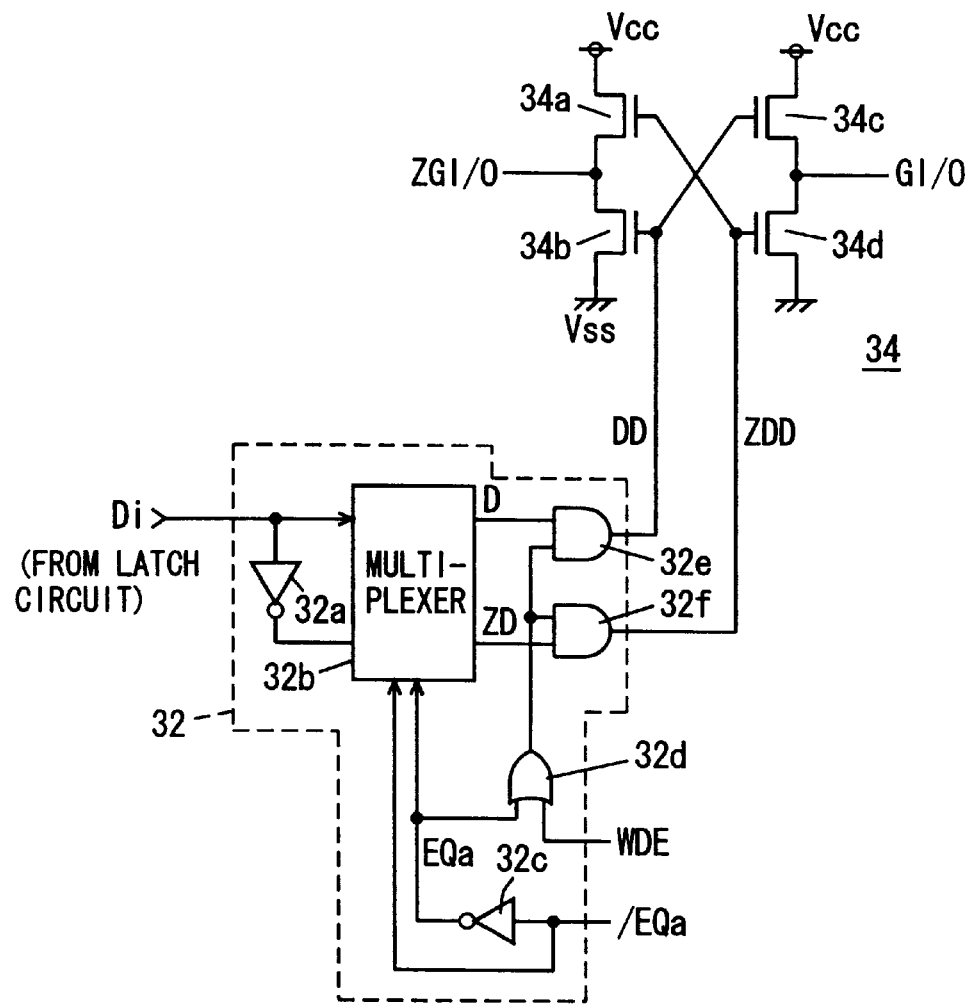
FIG. 14 is a diagram showing the arrangement of the data write buffer shown in FIG. 12.

FIG. 14 is a diagram showing an example of an arrangement of data write buffer 3aw shown in FIG. 12. In FIG. 14, data scramble circuit 32 includes an inverter circuit 32a for inverting internal write data Di received from latch circuit 30 (not shown in FIG. 14), a multiplexer 32b for switching the data transfer paths according to equalizing instruction signal (data inverting instruction signal) /EQa and an inverted equalizing instruction signal EQa applied via an inverter 32c, an OR circuit 32d receiving equalizing instruction signal EQa and write driver activating signal WDE, an AND circuit 32e receiving an output signal D of multiplexer 32b and an output signal of OR circuit 32d to generate a data signal DD, and an AND circuit 32f receiving an output signal ZD of multiplexer 32b and an output signal of OR circuit 32d to generate a data signal ZDD.

When equalizing instruction signal /EQa is at the logic "H" level or in the inactive state, multiplexer 32d outputs complementary data according to data Di applied from the latch circuit as output signals D and ZD. When, on the other hand, equalizing instruction signal /EQa attains the logic "L" level or the active state, multiplexer 32b switches the data signal transfer paths and outputs the logic-inverted complementary data of internal data Di as output signals D and ZD. AND circuits 32e and 32f are enabled when the output signal of OR circuit 32d is at the logic "H" level or in the active state, and output data signals DD and ZDD according to the signals received from multiplexer 32b. OR circuit 32d receives write driver activating signal WDE and equalizing instruction signal EQa. Thus, during the write operation (or during the activation of write driver activating signal WDE) data signals DD and ZDD are generated according to write data Di applied from the latch circuit. When the write operation is completed and equalizing instruction signal EQa is activated, AND circuits 32e and 32f generate logic-inverted data signals DD and ZDD.

Drive circuit 34 includes an n-channel MOS transistor 34a connected between the power supply node and global data line ZGI/O and receiving data signal ZDD at its gate, an n-channel MOS transistor 34b connected between global data line ZGI/O and the ground node and receiving data signal DD at its gate, an n-channel MOS transistor 34c connected between the power supply node and global data line GI/O and receiving data signal DD at its gate, and an n-channel MOS transistor 34d connected between global data line GI/O and the ground node and receiving data signal ZDD at its gate.

When data signal DD is at the logic "H" level and data signal ZDD is at the logic "L" level, MOS transistors 34a and 34d are in the nonconductive state, while MOS transistors 34b and 34c are rendered conductive, and global data line GI/O attains the logic "H" level, while global data line ZGI/O attains the logic "L" level. Conversely, when data signal DD is at the logic "L" level and data signal ZDD is at the logic "H" level, MOS transistors 34a and 34d are rendered conductive, while MOS transistors 34b and 34c are in the non-conductive state, and global data line GI/O attains the logic "L" level, while global data line ZGI/O attains the logic "H" level. Since drive circuit 34 drives at a high speed the global data lines GI/O and ZGI/O arranged to extend for a relatively long distance, at least the current drivability of discharging MOS transistors 34b and 34d is made sufficiently large. The current drivability of MOS transistors 34a and 34c need not particularly be made so large (the precharge voltage level, or the equalizing voltage level, of global data lines GI/O and ZGI/O is at the power-supply voltage Vcc level). After the completion of the write operation, either the set of MOS transistors 34a and 34d or the set of MOS transistors 34b and 34c is rendered conductive, and drives global data lines GI/O and ZGI/O in the direction opposite to the direction to the direction they were driven during the data write operation. In this way, global data line pair GIO can be equalized faster than when the equalization is performed using an equalizing MOS transistor Q10 singly.

Figure 15:
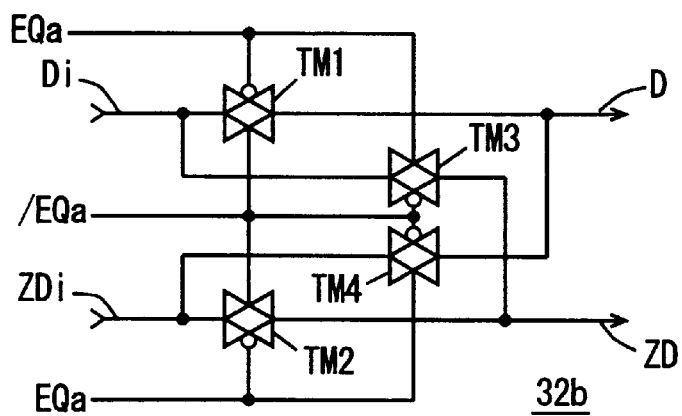
FIG. 15 is a diagram showing the arrangement of a multiplexer shown in FIG. 14.

FIG. 15 is a diagram showing an example of an arrangement of multiplexer 32b shown in FIG. 14. In FIG. 15, multiplexer 32b includes a CMOS transmission gate TM1 rendered conductive while equalizing instruction signals EQa and /EQa are in the inactive state for transmitting input data Di to an output node D (the node and the signal are designated by the same reference character), a CMOS transmission gate TM2 rendered conductive while equalizing instruction signals EQa and /EQa are in the inactive state for transmitting an inverted input data signal ZDi to an output node ZD, a CMOS transmission gate TM3 rendered conductive while equalizing instruction signals EQa and /EQa are activated for transmitting input data signal Di to output node ZD, and a CMOS transmission gate TM4 rendered conductive while equalizing instruction signals EQa and /EQa are activated for transmitting data signal ZDi to output node D.

When equalizing instruction signals EQa and /EQa are in the inactive state, input data signals Di and ZDi are transmitted to output nodes D and ZD, respectively. On the other hand, when equalizing instruction signals EQa and /EQa are in the active state, input data signals Di and ZDi are transmitted to output nodes ZD and D by CMOS transmission gates TM3 and TM4, respectively. In this way, a logic-inverted data signal of the data signal in the data write operation is output in the equalizing operation.

In the drive circuit 34 shown in FIG. 14, when data signals DD and ZDD are both at the logic "L" level, all of the MOS transistors 34a–34d become non-conductive, and drive circuit 34 enters an output high impedance state.

Figure 16:
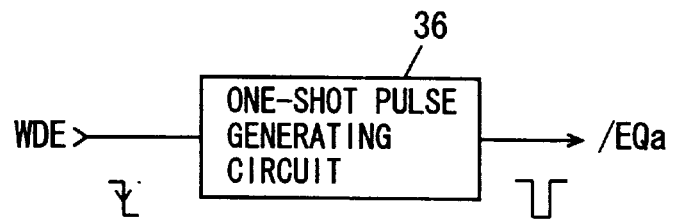
FIG. 16 is a schematic representation of a portion for generating an equalizing instruction signal Logic inverting instruction signal) shown in FIG. 14.

FIG. 16 is a schematic representation of the arrangement of a portion for generating equalizing instruction signal (logic inverting instruction signal) /EQa. In FIG. 16, the equalizing instruction signal generating portion is formed by a one-shot pulse generating circuit 36 for generating a one-shot pulse signal which turns to the logic "L" level for a prescribed period in response to the fall (deactivation) of write driver activating signal WDE. When write driver activating signal WDE is deactivated and the write operation is completed, equalizing instruction signal (logic inverting instruction signal) /EQa is activated. Write driver activating signal WDE is generated using the circuit configuration shown in the above-mentioned FIG. 5 or FIG. 8.

Figure 17:
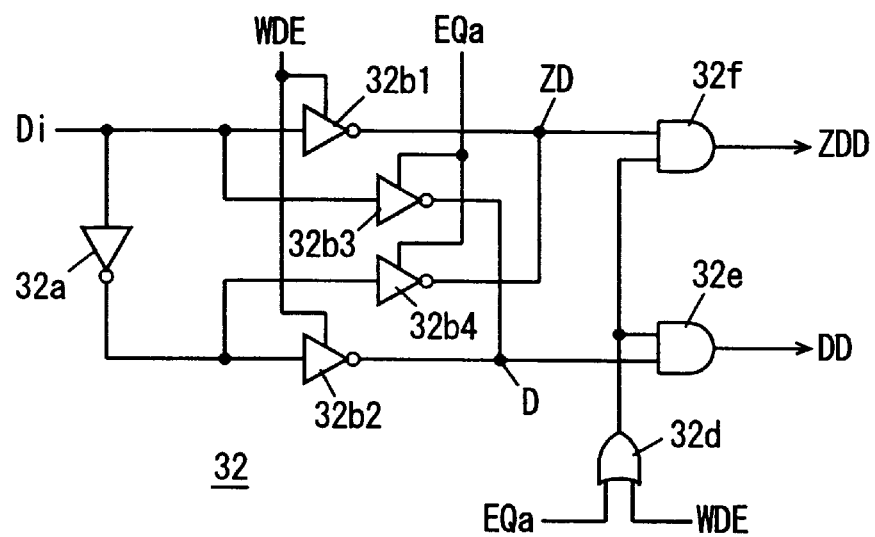
FIG. 17 is a diagram illustrating a modification of the multiplexer shown in FIG. 14.

First Modification of Data Scramble Circuit FIG. 17 is a diagram representing the arrangement of a modification of data scramble circuit 32. In FIG. 17, data scramble circuit 32 includes an inverter circuit 32a for inverting data Di from the latch circuit, tristate inverter buffers 32b1 and 32b2 made operative during the activation of write driver activating signal WDE for inverting data Di and an output signal from inverter circuit 32a, respectively, and tristate inverter buffers 32b3 and 32b4 made operative during the activation of equalizing instruction signal (data inverting instruction signal) EQa for inverting the data and the output signal from inverter circuit 32a. The outputs of tristate inverter buffers 32b1 and 32b4 are coupled in common to node ZD, and the outputs of tristate inverter buffers 32b3 and 32b2 are coupled in common to node D.

Data scramble circuit 32 further includes an AND circuit 32f for receiving a signal on node ZD and an output from OR circuit 32d to output data signal ZDD, and an AND circuit 32e for receiving the output signal from OR circuit 32d and a signal on node D to generate data signal DD. OR circuit 32d receives equalizing instruction signal EQa and write driver activating signal WDE.

In the arrangement shown in FIG. 17, during the data write operation, write driver activating signal WDE is driven to the active state, and accordingly, tristate inverter buffers 32b1 and 32b2 are made operative, while tristate inverter buffers 32b3 and 32b4 are in the output high impedance state. Thus, AND circuits 32e and 32f generate the complementary data signals DD and ZDD corresponding to data Di, and transmit these signals to the drive circuit. When the write operation is completed and the equalization begins, equalizing instruction signal EQa becomes active, and tristate inverter buffers 32b3 and 32b4 operate. On the other hand, tristate inverter buffers 32b1 and 32b2 attain the output high impedance state. In this condition, AND circuits 32e and 32f thus generate logic-inverted complementary data signals of the data signals in the data write operation.

When write driver activating signal WDE and equalizing instruction signal EQa both fall to the logic "L" level, data signals DD and ZDD from AND circuits 32e and 32f attain the logic "L" level.

As shown in FIG. 17, the use of tristate inverter buffers in place of CMOS transmission gates shown in FIG. 15 reduces the signal propagation delay in the data scramble circuit, thereby allowing a high-speed operation.

Second Modification of Data Scramble Circuit

Figure 18:
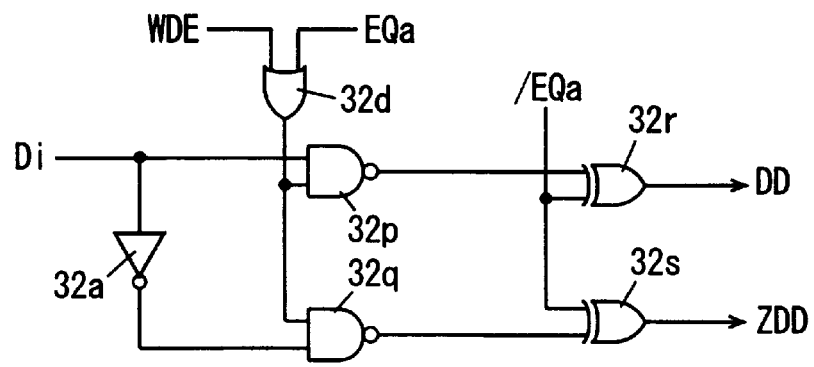
FIG. 18 is a diagram showing the arrangement of a modification of a data scramble circuit shown in FIG. 12.

FIG. 18 is a diagram showing the arrangement of the second modification of data scramble circuit 32. In FIG. 18, data scramble circuit 32 includes an NAND circuit 32p for receiving data Di from the latch circuit and an output signal from OR circuit 32d, and an NAND circuit 32q for receiving an output signal from inverter circuit 32a and the output signal from OR circuit 32d, an EXOR circuit 32r for receiving an output signal from NAND circuit 32p and equalizing instruction signal EQa, and an EXOR circuit 32s for receiving an output signal from NAND circuit 32q and equalizing instruction signal EQa. Data signal DD is output from EXOR circuit 32r and data signal ZDD is output from EXOR circuit 32s.

When a data write operation is performed, equalizing instruction signal EQa is at the logic "L" level and inverted equalizing instruction signal /EQa is at the logic "H" level. Thus, EXOR circuits 32r and 32s each operate as an inverter circuit, and NAND circuits 32p and EXOR circuit 32r form a buffer circuit. Moreover, NAND circuits 32q and 32s form a buffer circuit. Data signals DD and ZDD are generated according to write data Di applied from the latch circuit.

When the write operation is completed and the equalization begins, equalizing instruction signal EQa attains the logic "H" level, while inverted equalizing instruction signal /EQa attains the logic "H" level. In this condition, EXOR circuits 32r and 32s operate as a buffer circuit. Thus, data signals DD and ZDD become logic-inverted versions of the signals in the data write operation.

When the equalization is completed, write driver activating signal WDE and equalizing instruction signal EQa attain the logic "L" level, whereas the complementary equalizing instruction signal /EQa attains the logic "H" level. The output signals of NAND circuits 32p and 32q attain the logic "H" level and are inverted by EXOR circuits 32r and 32s, and data signals DD and ZDD both attain the logic "L" level. In this manner, the drive circuit enters the output high impedance state. In the arrangement shown in FIG. 18, only four gate circuits are used, and no switching of the signal propagation paths is performed. Thus, the number of components and the area occupied by the data write buffer can be reduced.

Second Arrangement of Data Write Buffer

Figure 19:
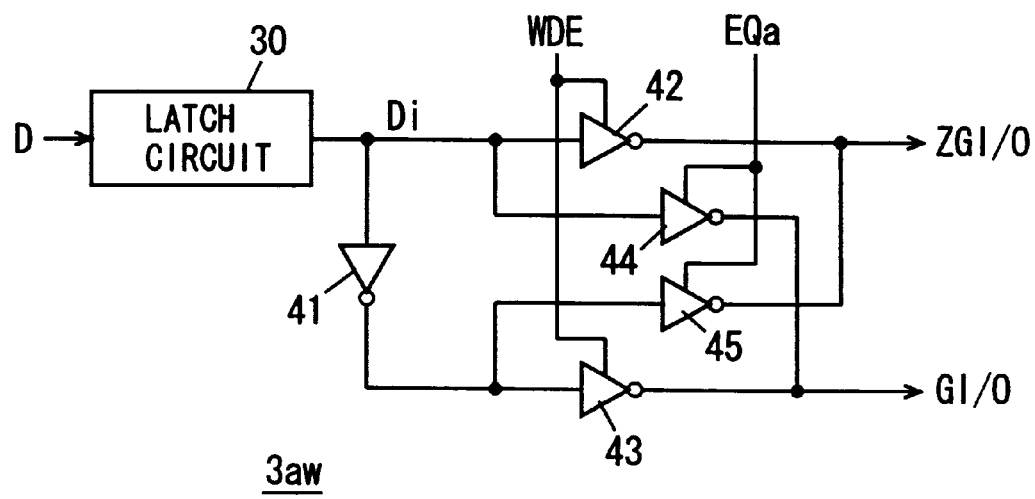
FIG. 19 is a diagram showing another arrangement of the data write buffer shown in FIG. 12.

FIG. 19 is a diagram depicting another arrangement of data write buffer 3aw. In FIG. 19, data write buffer 3aw includes a latch circuit 30 for latching internal write data D, an inverter circuit 41 for inverting latch data Di from latch circuit 30, tristate inverter buffers 42 and 43 for inverting output data Di from latch circuit 30 and an output signal from inverter circuit 41, respectively, in response to the activation of write driver activating signal WDE, and tristate inverter buffers 44 and 45 for inverting latch data Di from latch circuit 30 and the output signal from inverter circuit 41 in response to the activation of equalizing instruction signal (logic inverting instruction signal) EQa.

The outputs of tristate inverter buffers 42 and 45 are coupled to global data line ZGI/O, and the outputs of tristate inverter buffers 44 and 45 are coupled to global data line GI/O.

In a data write operation, write driver activating signal WDE is activated, and global data lines ZGI/O and GI/O are driven by tristate inverter buffers 42 and 43. At this time, tristate inverter buffers 44 and 45 are in the output high impedance state, and thus do not affect the data write operation in any way.

When the data write operation is completed and equalizing instruction signal EQa is activated, tristate inverter buffers 42 and 43 enter the output high impedance state, while tristate inverter buffers 44 and 45 are made operative and drive global data lines ZGI/O and GI/O according to output data Di from latch circuit 30 and the output signal from inverter circuit 41.

When the equalization is completed, tristate inverter buffers 44 and 45 enter the output high impedance state. With the arrangement of the data write buffer shown in FIG. 19, even when global data lines ZGI/O and GI/O transmit both the write data and the read data, the data read operation is not affected in any way. In addition, since the number of components are reduced, the circuit area occupied by data write buffer can also be reduced.

Third Arrangement of Data Write Buffer

Figure 20:
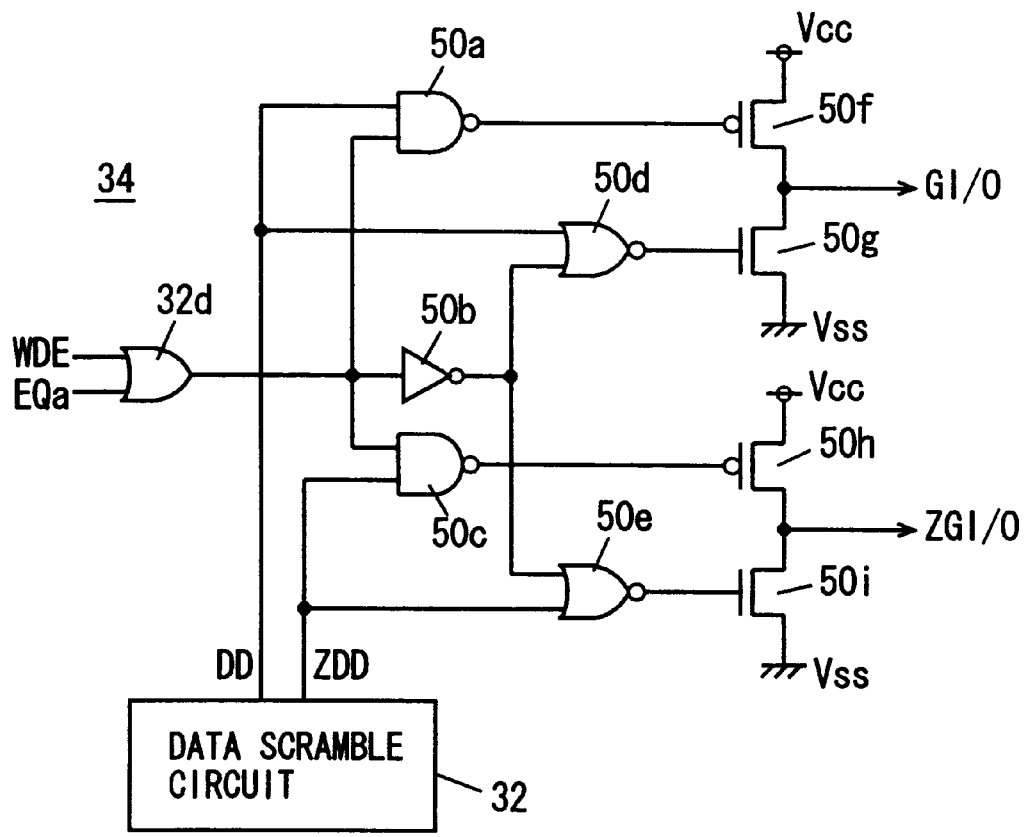
FIG. 20 is a diagram showing another arrangement of a drive circuit shown in FIG. 12.

FIG. 20 is a diagram showing a further arrangement of drive circuit 34 shown in FIG. 12. In FIG. 20, drive circuit 34 includes an NAND circuit 50a receiving data signal DD from data scramble circuit 32 and an output signal from OR circuit 32d, an inverter circuit 50b inverting an output signal from OR circuit 32b, an NAND circuit 50c for receiving data signal ZDD from data scramble circuit 32 and an output signal from OR circuit 32d, an NOR circuit 50d receiving data signal DD and an output signal from inverter circuit 50b, an NOR circuit 50e receiving the output signal from inverter circuit 50b and data signal ZDD, a p-channel MOS transistor 50f connected between the power supply node and global data line GI/O and receiving an output signal from NAND circuit 50a at its gate, an n-channel MOS transistor 50g connected between global data line GI/O and the ground node and receiving an output signal from NOR circuit 50d at its gate, a p-channel MOS transistor 50h connected between the power supply node and global data line ZGI/O and receiving an output signal from NAND circuit 50c at its gate, and an n-channel MOS transistor 50i connected between global data line ZGI/O and the ground node and receiving an output signal from NOR circuit at its gate 50e. OR circuit 32d receives write driver activating signal WDE and equalizing instruction signal (data inverting instruction signal) EQa. Data scramble circuit 32 has one of the arrangements shown in the above-mentioned FIG. 15, 17 and 18. The operation will be briefly described below.

In the standby, the output signal of OR circuit 32d is at the logic "L" level, while the output signal of inverter circuit 50b is at the logic "H" level. Consequently, the output signals of NAND circuits 50a and 50c attain the logic "H" level, and the output signals of NOR circuits 50d and 50e attain the logic "L" level. Thus, MOS transistors 50f, 50g, 50h, and 50i all become non-conductive, and drive circuit 34 enters the output high impedance state.

In the data write operation, first, the output signal of OR circuit 32d attains the logic "H" level, and the output signal of inverter circuit 50b attains the logic "L" level. Accordingly, NAND circuits 50a and 50c and NOR circuits 50d and 50e operate as inverters. During the data write operation (or while signal WDE is activated), data scramble circuit 32 generates data signals DD and ZDD according to the received write data. When data signal DD is at the logic "H" level, the output signals of NAND circuit 50a and NOR circuit 50d attain the logic "L" level, whereas the output signals of NAND circuit 50c and NOR circuit 50e attain the logic "H" level. Thus, global data line GI/O is coupled to the power supply node via p-channel MOS transistor 50f, and global data line ZGI/O is coupled to the ground node via MOS transistor 50i.

When the data write operation is completed and the equalization begins, equalizing instruction signal EQa becomes active. In this condition, NAND circuits 50a and 50c and NOR circuits 50d and 50e operate as inverters. On the other hand, data scramble circuit 32 inverts the logic levels of output data signals according to equalizing instruction signal EQa. Thus, the logic levels of the output signals from NAND circuits 50a and 50c and NOR circuits 50d and 50e are inverted, and global data lines GI/O and ZGI/O are driven to the voltage levels in the opposite direction with respect to the voltage levels in the write operation. When equalizing instruction signal EQa becomes inactive or attains the logic "L" level, the output signal of OR circuit 32d attains the logic "L" level, and drive circuit 34 enters the output high impedance state once again.

As shown in FIG. 20, the use of a CMOS inverter in the portion for driving global data lines GI/O and ZGI/O similarly allows the transmission of logic-inverted data of the write data on the global data lines equalization after upon the completion of the write operation.

Modification

Figure 21:
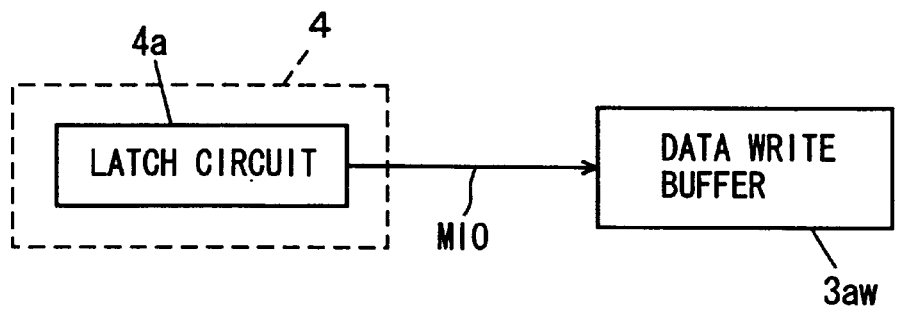
FIG. 21 is a schematic representation of the arrangement of a modification of the second embodiment of the present invention.

FIG. 21 is a schematic representation of a modification of the second embodiment of the present invention. A latch circuit 4a is provided in a data input/output circuit 4 in the arrangement shown in FIG. 21. The latch circuit is not provided in a data write buffer 3aw. Latch circuit 4a is thus coupled to data write buffer 3aw via a main data line pair MIO. Since there is no need to provide a latch circuit 30, the area occupied by the data write buffer can be reduced, and the data write buffer can be disposed with sufficient margin according to the pitch of the global data line pairs.

As seen from the above, according to the second embodiment of the present invention, a hierarchical data line structure is formed such that, after the completion of the write operation of the write data, logic-inverted data of the write data is transmitted on a global data line upon the equalization of the data lines. As a result, global data lines can be equalized at a higher speed (the write recovery time is shortened).

Moreover, the arrangement in which read data bus and write data bus are separately arranged as shown in FIG. 11 may also be used in the second embodiment of the present invention. Consequently, the write cycle time can be shortened, and a high-speed write operation becomes possible.

Third Embodiment

Figure 22:
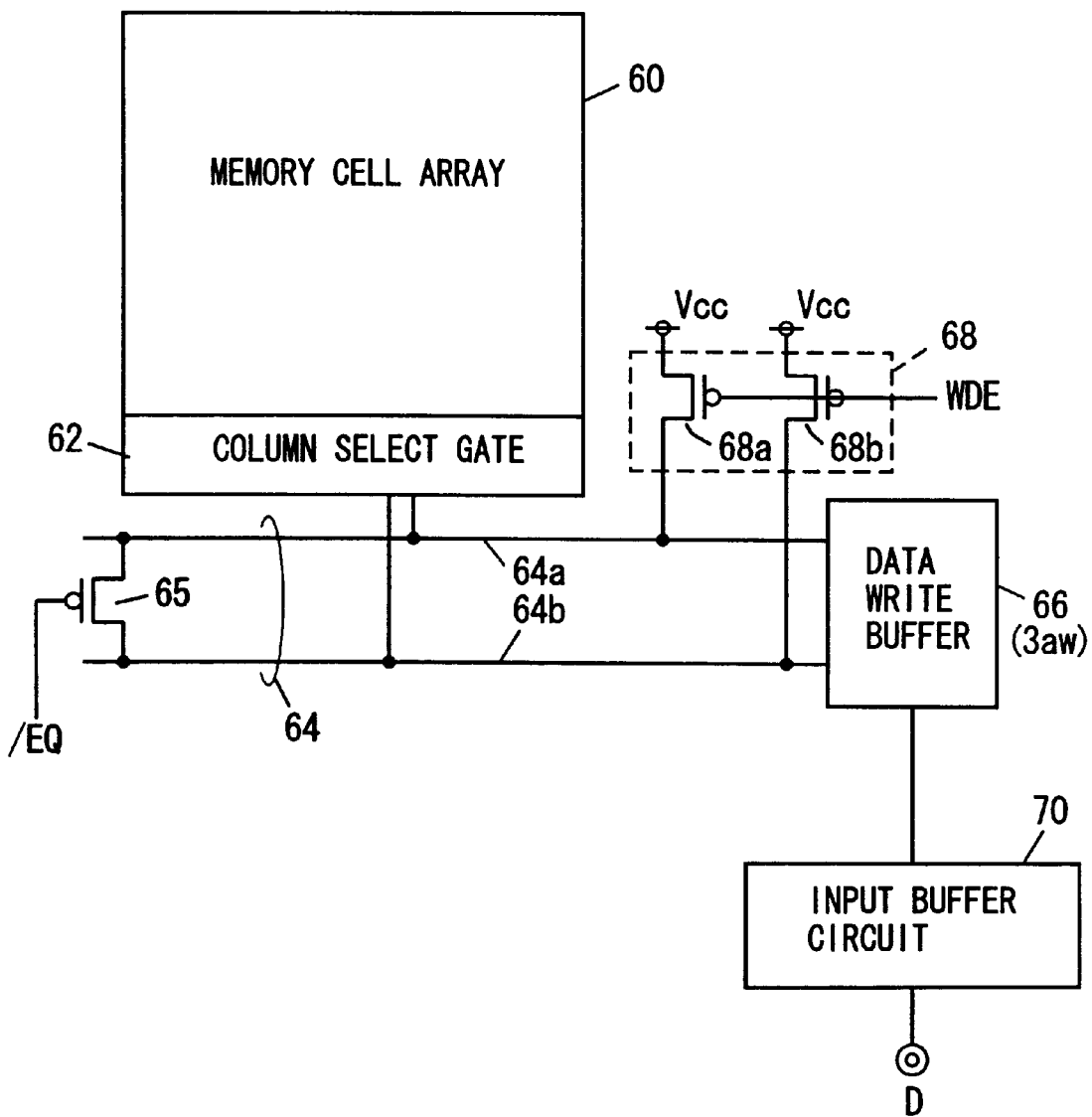
FIG. 22 is a schematic representation of a main portion of the semiconductor memory device according to a third embodiment of the present invention.
Figure 23:
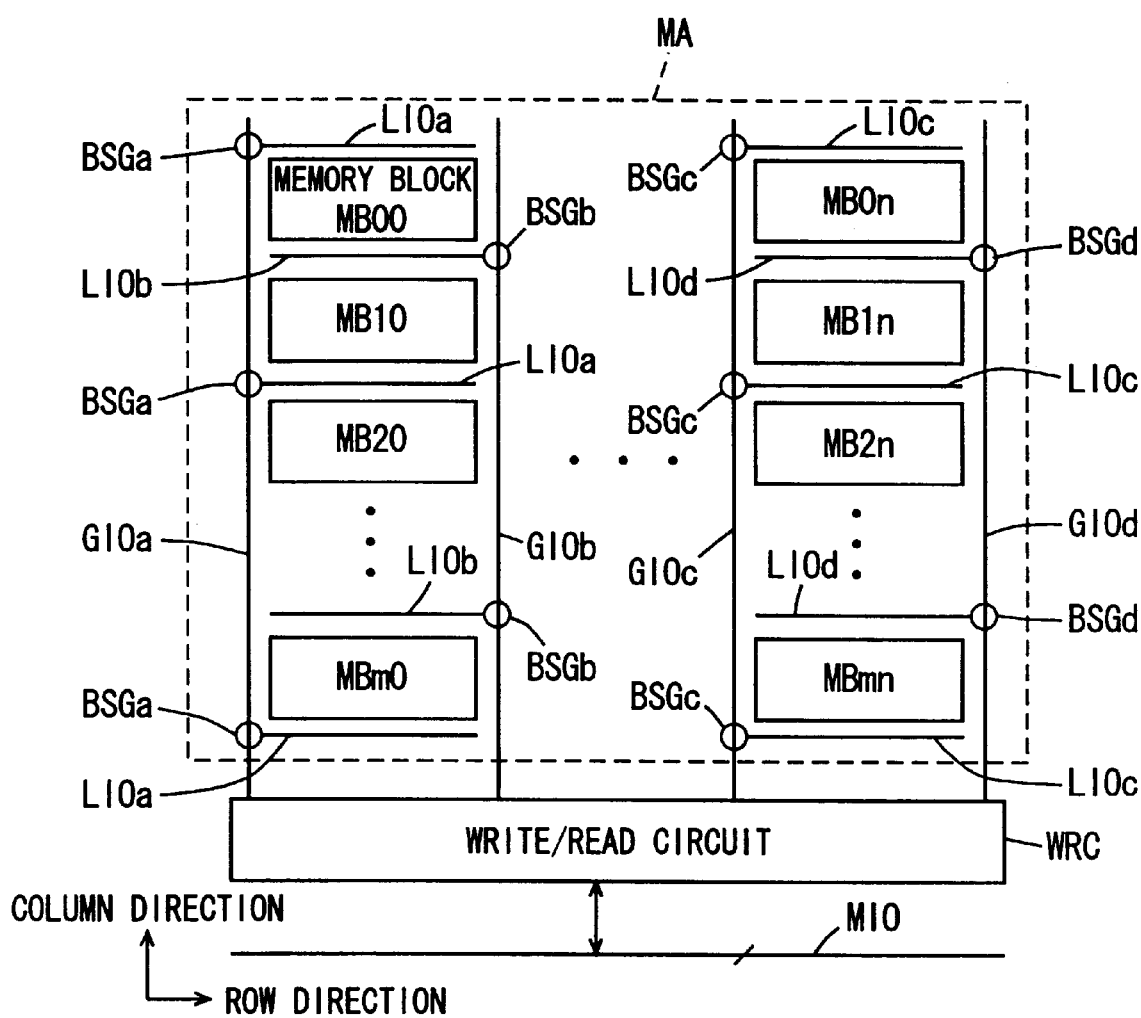
FIG. 23 is a schematic representation of the arrangement of an array portion in a conventional semiconductor memory device.
Figure 24:
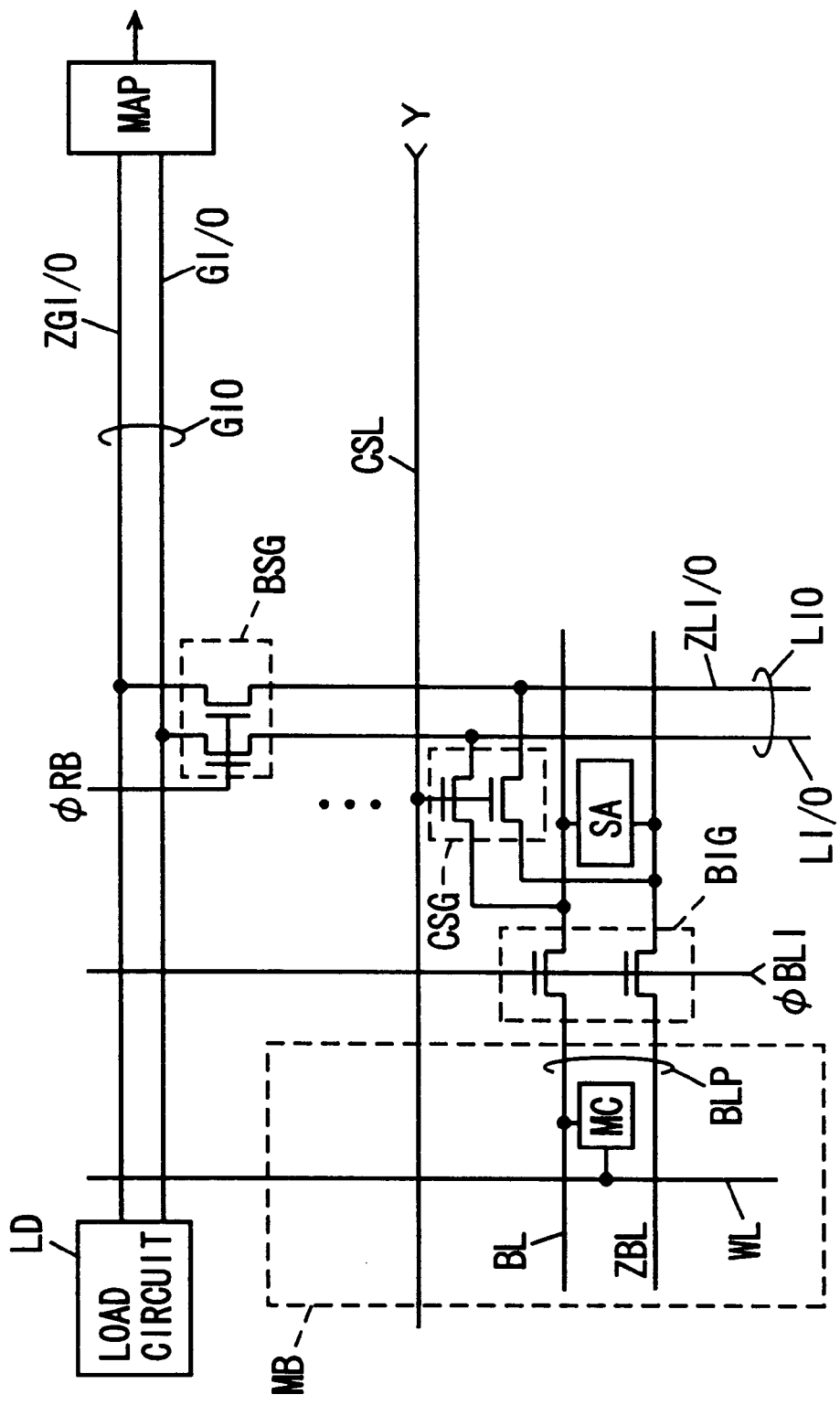
FIG. 24 is a diagram showing the arrangement of the array portion shown in FIG. 23 in greater detail.
Figure 25:
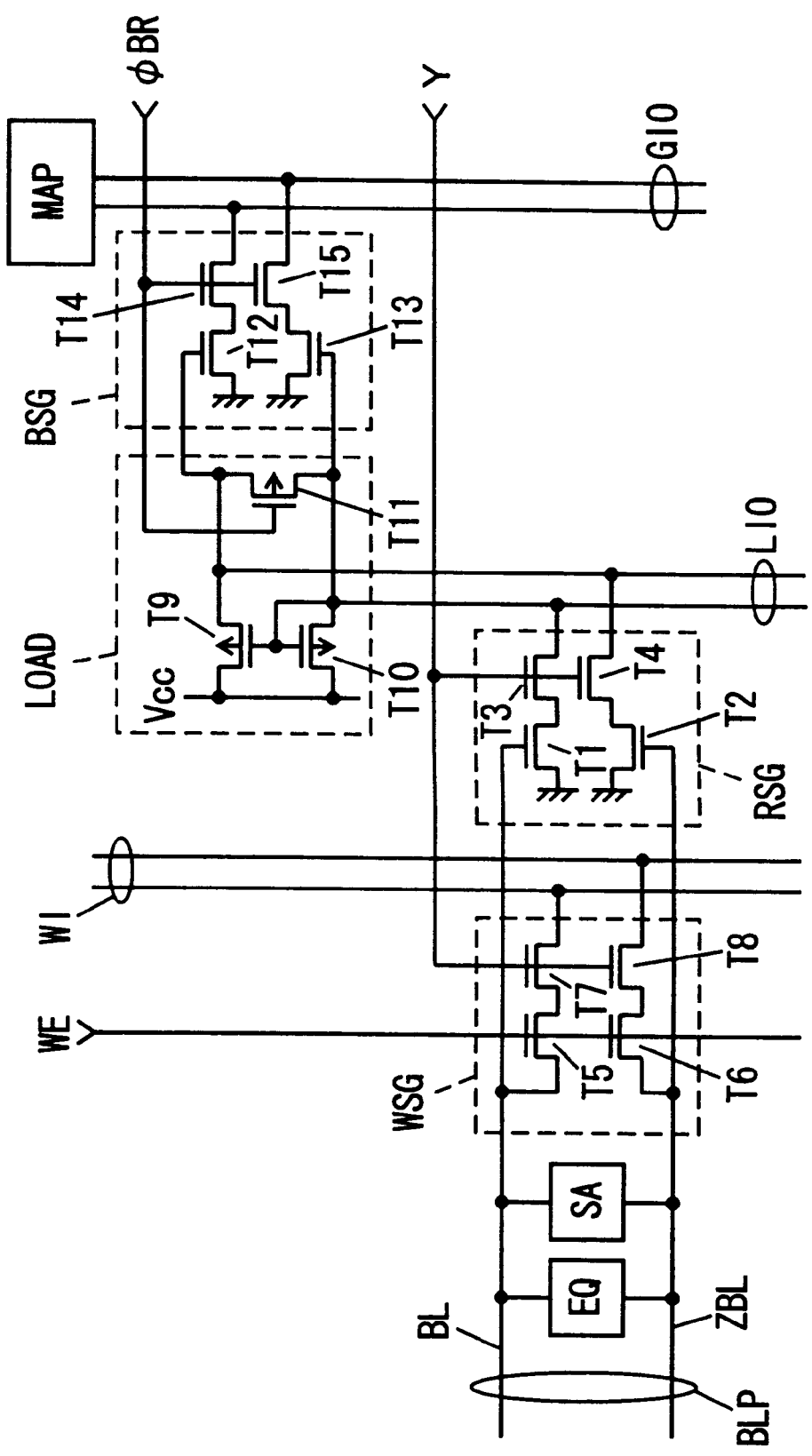
FIG. 25 is a diagram representing the arrangement of a data read portion of a conventional semiconductor memory device.
Figure 26:
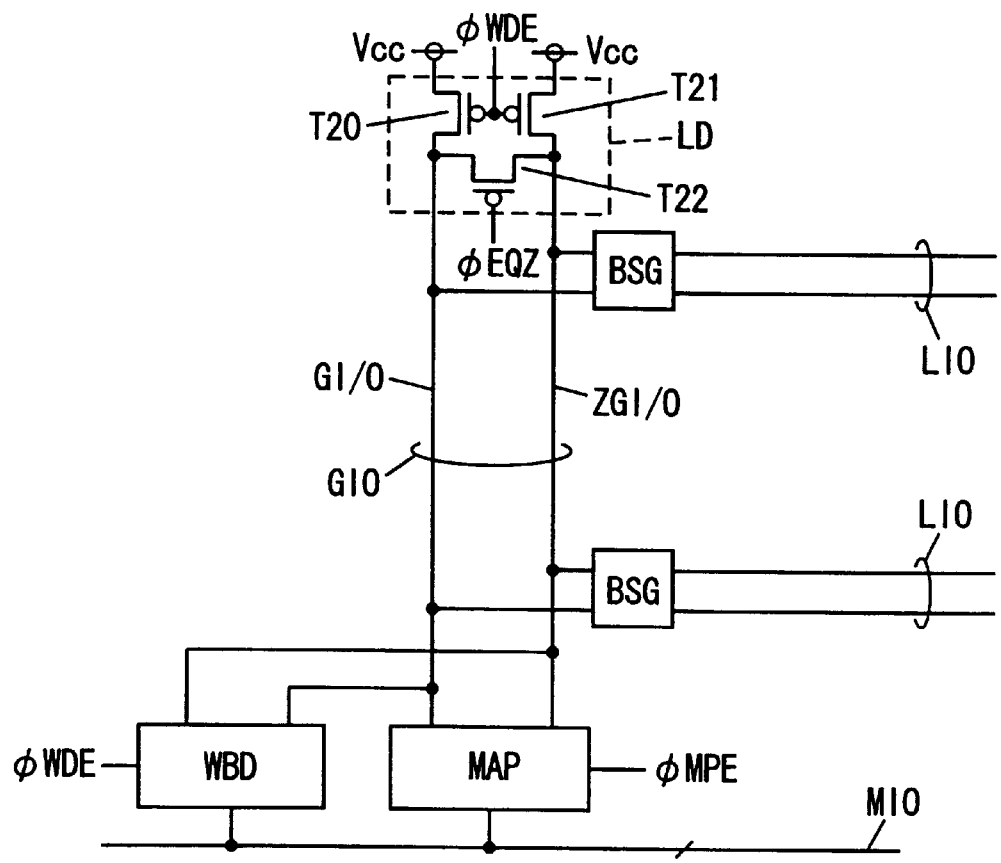
FIG. 26 is a schematic representation of the portion related to an internal data line in a conventional semiconductor memory device.
Figure 27:
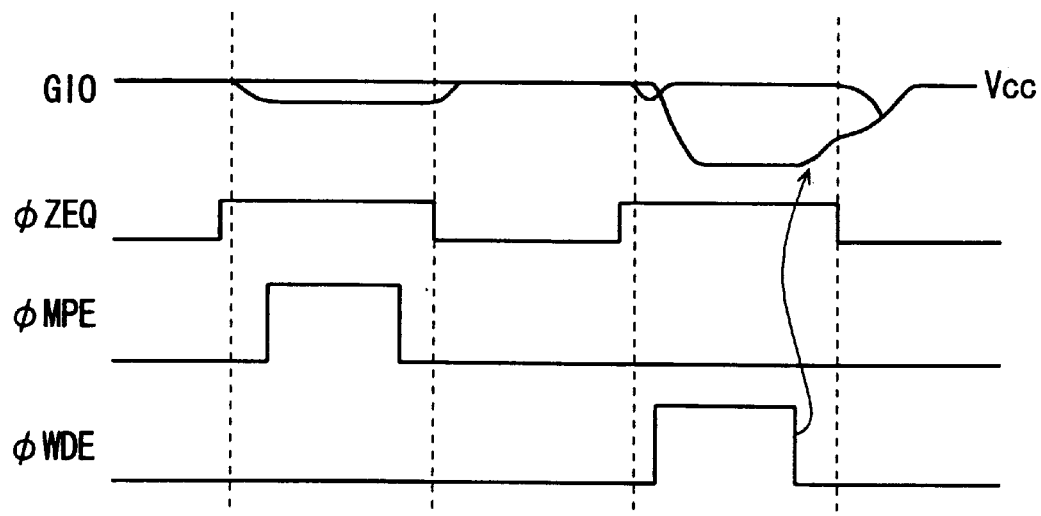
FIG. 27 is a signal waveform diagram representing the operation of the circuit shown in FIG. 26.
Figure 28:
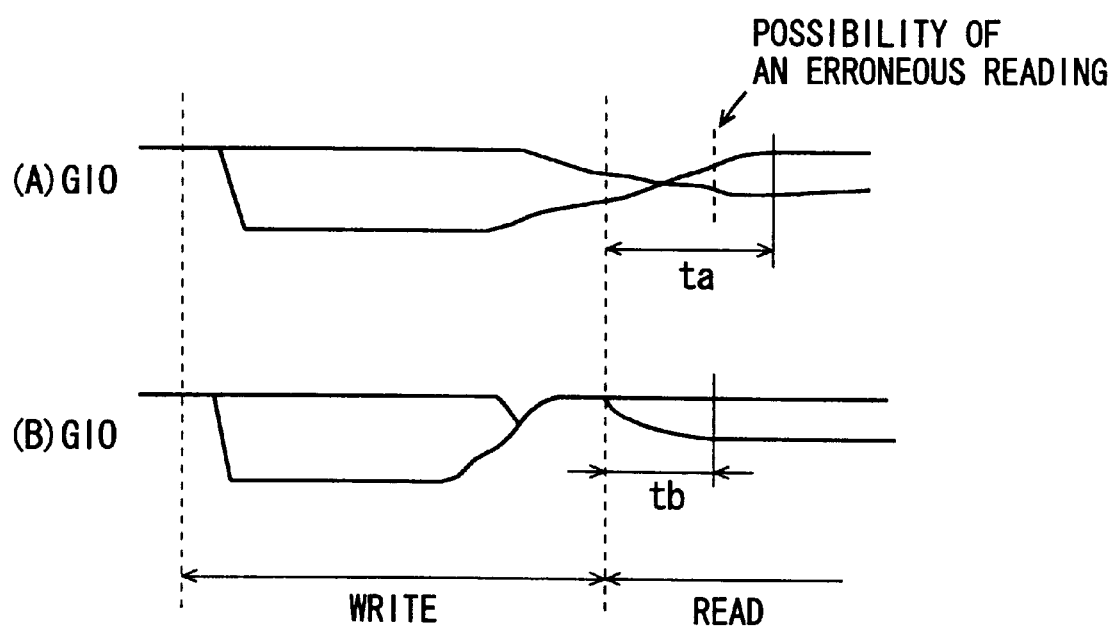
FIG. 28 is a diagram representing the data write operation of a conventional semiconductor memory device in greater detail.

FIG. 22 is a schematic representation of a main portion of the semiconductor memory device according to the third embodiment of the present invention. FIG. 22 shows the arrangement of the portion related to the data write operation. In FIG. 22, the semiconductor memory device includes a memory cell array 60 having a plurality of memory cells arranged in a matrix of rows and columns, a column select gate 62 for selecting an addressed column of memory cell array 60, an internal data line pair 64 for transmitting write data to the column of memory cell array 60 selected by column select gate 62, an equalizing transistor 65 formed by, a p-channel MOS transistor for equalizing the voltages of internal data line pair 64 in response to the activation of equalizing instruction signal /EQ, and a load circuit 68 for pulling up internal data lines 64a and 64b to the power-supply voltage Vcc level. Load circuit 68 includes pull-up transistors 68a and 68b formed by p-channel MOS transistors made conductive during the deactivation of write driver activating signal WDE, and for transmitting the power-supply voltage Vcc to internal data lines 64a and 64b.

A data write buffer 66 which is activated in the data write mode for generating internal write data according to the write data received from an input buffer circuit 70 is provided to internal data line pair 64. Data write buffer 66 has a configuration similar to that of data write buffer 3aw described above with respect to the second embodiment.

In the arrangement shown in FIG. 22, data write buffer 66 transmits the write data on a selected column of memory cell array 60 via internal data lines 64. Load circuit 68 is in the inactive state during the data write operation, and is activated after the completion of the write operation. When the write operation is completed, equalizing signal /EQ is activated, thereby equalizing the voltages of internal data lines 64a and 64b. Thus, as in the second embodiment described above, data write buffer 66 (3aw) transmitting the logic-inverted data of the write data upon the equalization makes the high-speed equalization of the voltages on internal data lines 64a and 64b possible while successfully reducing the write recovery time (load circuit 68 has only a pull-up function, and its current drivability is low).

Unlike the second embodiment, internal data line pair 64 does not necessarily have a hierarchical data line structure. In addition, internal data line pair 64 may transmit the read data. During the transmission of the read data, load circuit 68 functions as load resistance and limits the amplitude of read data signals which appears on internal data lines 64a and 64b. Further, input buffer circuit 70 may be included in an input/output buffer circuit, and data may be input or output via the same input/output node.

Moreover, memory cell array 60 may be formed by dynamic memory cells (1 transistor/1 capacitor-type) or by static memory cells (having a flip-flop as a storage element) arranged in a matrix of rows and columns. The third embodiment is applicable to any semiconductor memory device in which internal data lines 64 are equalized after the completion of the data write operation.

Furthermore, if write data and read data are transmitted through separate data lines, the data bus lines for transmitting the write data may be configured to be equalized to an intermediate voltage level.

As seen from the above, according to the third embodiment of the present invention, since the logic-inverted data of the write data is written to the data bus lines upon equalization after the completion of the data write operation, the data lines can be equalized at a high speed, and the write recovery time can be shortened.

According to the present invention, data lines can be driven at a higher speed, and the access time can be reduced. Thus, a semiconductor memory device which operates at a high speed is realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory blocks each having a plurality of memory cells arranged in a matrix of rows and columns, and arranged in alignment at least in a column-direction;
   a plurality of local data line pairs provided corresponding to said memory blocks, each of said plurality of local data line pairs being coupled to a selected memory cell in a corresponding memory block;
   a global data line pair provided in common to the memory blocks arranged in alignment in the column-direction;
   a plurality of read gate amplifiers each provided between each of said plurality of local data line pairs and said global data line pair, for transmitting, when selected, a signal of a corresponding local data line pair to said global data line pair, with said corresponding local data line pair and said global data line pair being electrically isolated; and
   a current supply load circuit coupled to said global data line pair for supplying a current of a same magnitude to each data line of said global data line pair.

2. The semiconductor memory device according to claim 1, wherein each of the read gate amplifiers includes a pair of insulated gate field effect transistors each having a gate connected to a local data line of a corresponding local data line pair.

3. The semiconductor memory device according to claim 1, wherein said current supply load circuit includes a current mirror circuit.

4. The semiconductor memory device according to claim 1, further comprising a write gate provided for each of the local data line pairs for electrically connecting said global data line pair to a corresponding local data line pair in response to a block select signal in a data write mode.

5. The semiconductor memory device according to claim 2, wherein each of the read gate amplifiers further includes a select transistor pair connected in series with the field effect transistor pair and rendered conductive in response to a block select signal in a read operation, and said field effect transistor pair and said select transistor pair are connected in series between said global data line pair and a reference voltage node.

6. The semiconductor memory device according to claim 5, further comprising an equalizing circuit coupled to said global data line pair for equalizing voltages of said global data line pair in response to an equalizing instruction signal and a write circuit for generating an internal write data according to an externally applied write data and transmitting the internal write data to said global data line pair, wherein said write circuit generates a logic-inverted data of said internal write data in response to activation of said equalizing instruction signal and transmitting the logic-inverted data to said global data line pair.

7. The semiconductor memory device according to claim 6, wherein said write circuit includes
   a latch circuit for latching a first internal write data produced according to the externally applied write data,
   a scramble circuit coupled to said latch circuit, for producing complementary data signals in accordance with the first internal write data received from the latch circuit, said scramble circuit including a gating circuit for exchanging paths of transferring the complementary data signals in response to activation of the equalizing instruction signal, and
   a buffer driver for driving the global data line pair in accordance with the complementary data signals to transmit a second internal write data to the global data line pair when one of said equalizing instruction signal and a data write enabling signal is active.

8. The semiconductor memory device according to claim 6, wherein said write circuit includes
   a latch circuit for latching a first internal write data produced according to the externally applied write data,
   a scramble circuit coupled to said latch circuit, for producing complementary data signals in accordance with the first internal write data received from the latch circuit, said scramble circuit including a gate circuit for inverting the complementary data signals in response to activation of said equalizing instruction signal, and
   a driver for driving the global data line pair in accordance with the complementary data signals received from the scramble circuit to transmit a second internal write data onto the global data line pair.

9. The semiconductor memory device according to claim 6, wherein said write circuit includes
   a latch circuit for latching a first internal write data produced according to the externally applied write data, and
   a scramble/dive circuit coupled to said latch circuit, for producing complementary data signals according to the first internal write data to drive the global data line pair in accordance with the complementary data signals and for transmitting a second internal write data onto the global data line pair, said scramble/drive circuit including a first drive circuit activated in response to a data write enabling signal being active for driving the global data line pair in accordance with the complementary data signals, and a second drive circuit activated in response to activation of the equalizing instruction signal, for driving the global data line pair in a manner opposite to driving of the first drive circuit.

10. A semiconductor memory device, comprising:
    a plurality of memory cells;
    an internal data line pair for transmitting write data to a selected memory cell of said plurality of memory cells;
    an equalizing circuit coupled to said internal data line pair for equalizing voltages of said internal data line pair in response to an equalizing instruction signal; and
    a write circuit for generating an internal write data according to an externally applied write data and transmitting the internal write data to said internal data line pair, said write circuit generating a logic-inverted data of said internal write data in response to activation of said equalizing instruction signal and transmitting the logic-inverted data to said internal data line pair.

11. The semiconductor memory device according to claim 10, wherein said internal data line pair further transmits internal read data read out from said selected memory cell.

12. The semiconductor memory device according to claim 10, wherein said write circuit includes a latch circuit for latching said internal write data, an internal data generating circuit for receiving latch data from said latch circuit in deactivation of said equalizing instruction signal and outputting the latch data, and for logic-inverting the latch data received from said latch circuit in response to activation of said equalizing instruction signal and outputting logic-inverted latch data.

13. The semiconductor memory device according to claim 12, further comprising a drive circuit for driving said internal data line pair according to the data output from said internal data generating circuit.

14. The semiconductor memory device according to claim 10, further comprising a load circuit coupled to said internal data line pair.

15. A semiconductor memory device, comprising:
- a plurality of array blocks each including a plurality of memory cells arranged in a matrix of rows and columns and a plurality of bit line pairs arranged corresponding to the columns and connecting memory cells of corresponding columns;
- a plurality of local data line pairs arranged extending in a row-direction and corresponding to said plurality of array blocks;
- a plurality of column select gates disposed corresponding to said plurality of bit line pairs in each of said plurality of array blocks, for electrically connecting a bit line pair corresponding to a selected column to a corresponding local data line pair in response to a column select signal;
- a global data line pair extending in a column-direction and arranged in common to array blocks, of said plurality of array blocks, disposed in alignment in the column-direction;
- a plurality of read gates each provided between each of said local data line pairs and said global data line pair, each of said plurality of read gates including a select gate pair made conductive in response to a block select signal activated according to an address signal in a data read mode, and a differential gate pair including an insulated gate field effect transistor receiving a signal on a corresponding local data line pair at a gate thereof, said differential gate pair and said select gate pair being connected in series between said global data line pair and a reference voltage node; and
- a current mirror-type load circuit coupled to said global data line pair, for supplying, when activated, current to said global data line pair.

16. A semiconductor memory device comprising:
- a plurality of memory blocks each having a plurality of memory cells arranged in a matrix of rows and columns;
- a plurality of local data line pairs provided corresponding to said plurality of memory blocks, each for communicating data with a selected memory cell in a corresponding memory block;
- a global data line pair provided in common to the memory blocks;
- a plurality of read gate amplifiers each provided between each of said plurality of local data line pairs and said global data line pair, for transmitting, when selected, a signal of a corresponding local data line pair to said global data line pair; and
- a current supply load circuit coupled to said global data line pair for supplying a current to each data line of said global data line pair.

17. The semiconductor memory device according to claim 16, wherein each of said plurality of read gate amplifiers includes an input transistor pair including insulated gate field effect transistors having gates respectively connected to local data lines of a corresponding local data line pair.

18. The semiconductor memory device according to claim 17, wherein each of said plurality of read gate amplifiers further includes a select transistor pair connected in series with said input transistor pair and turned on in response to a block select signal in a read operation, and said input transistor pair and said select transistor pair are connected in series between said global data line pair and a predetermined voltage node.

19. The semiconductor memory device according to claim 18, wherein said select transistor pair is connected to said global data line pair, and said input transistor pair is connected between said select transistor pair and said predetermined voltage node.

20. The semiconductor device according to claim 16, wherein said current supply load circuit includes a current mirror circuit.

21. The semiconductor memory device according to claim 16, further comprising a plurality of write gates provided corresponding to said plurality of local data line pairs, each for electrically connecting said global data line pair to a corresponding local data line pair in response to a block select signal write operation.

22. The semiconductor memory device according to claim 21, further comprising:
- a equalizing circuit coupled to said global data line pair for equalizing voltages of said global data line pair in response to an equalizing instruction signal; and
- a write circuit for generating an internal write data according to an externally applied write data and transmitting the internal write data to said global data line pair, and for generating a logic-inverted data of said internal write data in response to activation of said equalizing instruction signal and transmitting the logic-inverted data to said global data line pair.

23. The semiconductor memory device according to claim 22, wherein said write circuit includes:
- a latch circuit for latching a first internal write data produced according to the externally applied write data,
- a scramble circuit coupled to said latch circuit, for producing complementary data signals in accordance with the first internal write data received from said latch circuit, said scramble circuit including a gate circuit for exchanging paths of transferring the complementary data signals in response to activation of the equalizing instruction signal, and
- a buffer driver for driving said global data line pair in accordance with the complementary data signals to transmit a second internal write data to said global data line pair when one of said equalizing instruction signal and a data write enabling signal is active.

24. The semiconductor memory device according to claim 22, wherein said write circuit includes:
- a latch circuit for latching a first internal write data produced according to the externally applied write data,
- a scramble circuit coupled to said latch circuit, for producing complementary data signals in accordance with the first internal write data received from said latch circuit, said scramble circuit including a gate circuit for inverting the complementary data signals in response to activation of the equalizing instruction signal, and
- a driver for driving said global data line pair in accordance with the complementary data signals received from said scramble circuit to transmit a second internal write data onto said global data line pair.

25. The semiconductor memory device according to claim 22, wherein said write circuit includes:
- a latch circuit for latching a first internal write data produced according to the externally applied write data, and a scramble/drive circuit coupled to said latch circuit, for producing complementary data signals according to the first internal write data to drive said global data line pair in accordance with the complementary data signal, and for transmitting a second internal write data onto said global data line pair, said scramble/drive circuit including a first drive circuit activated in response to a data write enabling signal being active for driving said global data line pair in accordance with the complementary data signals, and a second drive circuit activated in response to activation of the equalizing instruction signal, for driving said global data line pair in a manner opposite to driving of the first drive circuit.

26. The semiconductor memory device according to claim 16, wherein the read gate amplifier is selected in said plurality of read gate amplifiers in response to block select signals.

27. The semiconductor memory device according to claim 16, further comprising a switch coupled between said current supply load circuit and a power supply, for electrically separating said current supply load circuit from the power supply in a write operation.

* * * * *